(12) United States Patent
Nguyen

(10) Patent No.: US 9,735,799 B1
(45) Date of Patent: Aug. 15, 2017

(54) ENVELOPE-DEPENDENT NOISE-SHAPED SEGMENTATION IN OVERSAMPLING DIGITAL-TO-ANALOG CONVERTERS

(71) Applicant: ANALOG DEVICES, INC., Norwood, MA (US)

(72) Inventor: Khiem Quang Nguyen, Tewksbury, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 15/223,220

(22) Filed: Jul. 29, 2016

(51) Int. Cl.
| | | |
|---|---|---|
| H03M 1/66 | (2006.01) | |
| H03M 1/06 | (2006.01) | |
| H03M 1/00 | (2006.01) | |
| H03M 1/74 | (2006.01) | |

(52) U.S. Cl.
CPC ............. H03M 1/66 (2013.01); H03M 1/06 (2013.01); H03M 1/00 (2013.01); H03M 1/747 (2013.01)

(58) Field of Classification Search
CPC ................................ H03M 1/747; H03M 1/00
USPC .................. 341/144, 118, 145, 152; 375/252
See application file for complete search history.

(56) References Cited

U.S. PATENT DOCUMENTS

| | | | |
|---|---|---|---|
| 5,404,142 A | 4/1995 | Adams et al. | |
| 5,977,899 A | 11/1999 | Adams | |
| 7,307,568 B1 | 12/2007 | Nguyen | |
| 7,777,658 B2 | 8/2010 | Nguyen et al. | |
| 7,812,753 B1 | 10/2010 | Myles et al. | |
| 8,842,032 B2 | 9/2014 | Nguyen | |
| 9,484,947 B1 | 11/2016 | Nguyen | |
| 2015/0048959 A1* | 2/2015 | Zhu ................ | H03M 1/0617 341/118 |
| 2015/0171891 A1 | 6/2015 | Stoops et al. | |

OTHER PUBLICATIONS

Lars Risbo et al., *Digital Approaches to ISI-Mitigation in High-Resolution Oversampled Multi-level D/A Converters*, IEEE Journal of Solid-State Circuits, vol. 46, No. 12, Dec. 2011, 12 pages.
OA1 (Non-Final Office Action) issued in U.S. Appl. No. 14/869,154 mailed May 3, 2016, 8 pages.

(Continued)

*Primary Examiner* — Joseph Lauture
(74) *Attorney, Agent, or Firm* — Patent Capital Group

(57) ABSTRACT

Improved mechanisms for applying noise-shaped segmentation techniques in a multi-bit DAC are disclosed. Noise-shaped segmentation refers to constructing two or more noise-shaped signals whose sum equals the original digital input signal by splitting each word of the input signal into two or more sub-words and converting each sub-word by a respective sub-word DAC group. Disclosed mechanisms include determining a range of amplitudes of a portion of the input signal over a certain time period, and, when converting digital words of that portion to analog values, limiting the number of sub-word DAC groups which are used for the conversion only to a number that is necessary for generating an analog output corresponding to the portion being evaluated, which number is determined based on the tracked amplitudes and could be smaller than the total number of sub-word DAC groups. Placing unused sub-word DAC groups into a power saving mode reduces power consumption.

28 Claims, 20 Drawing Sheets

(56) References Cited

OTHER PUBLICATIONS

Notice of Allowance issued in U.S. Appl. No. 14/869,154 mailed Jul. 8, 2016, 7 pages.
Khiem Nguyen et al., "A 108 dB SNR, 1.1 mW Oversampling Audio DAC With a Three-level DEM Technique", IEEE Xplore Abstract, IEEE.org, Sep. 9, 2015, 2 pages.

* cited by examiner

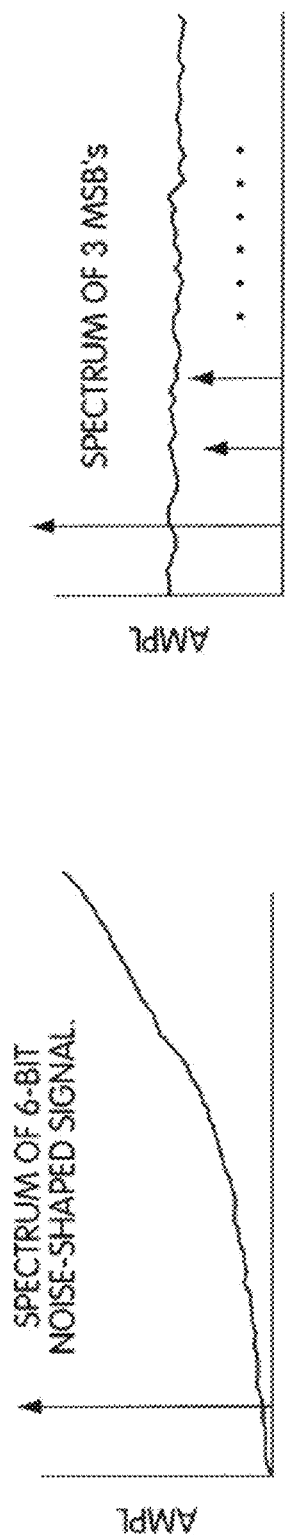
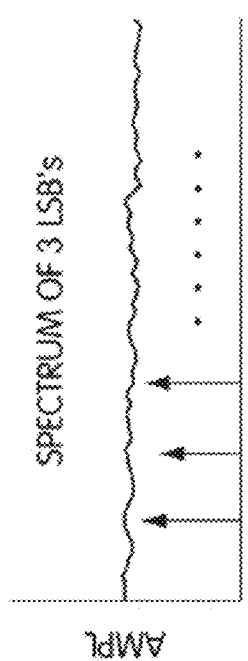
FIGURE 4B
FIGURE 4C
FIGURE 4A

US 9,735,799 B1

ENVELOPE-DEPENDENT NOISE-SHAPED SEGMENTATION IN OVERSAMPLING DIGITAL-TO-ANALOG CONVERTERS

TECHNICAL FIELD OF THE DISCLOSURE

The present disclosure relates generally to digital-to-analog converters and, more particularly, to methods and systems for controlling noise-shaped segmentation/splitting in oversampling digital-to-analog converters.

BACKGROUND

Real-world analog signals such as temperature, pressure, sound, or images are routinely converted to a digital representation that can be easily processed in modern digital systems. In many systems, this digital information must be converted back to an analog form to perform some real-world function. The circuits that perform this step are digital-to-analog converters (DACs), and their outputs may be used to drive a variety of devices. Loudspeakers, video displays, motors, mechanical servos, radio frequency (RF) transmitters, and temperature controls are just a few diverse examples. DACs are often incorporated into digital systems in which real-world signals are digitized by analog-to-digital converters (ADCs), processed, and then converted back to analog form by DACs. In these systems, the performance required of the DACs will be influenced by the capabilities and requirements of the other components in the system.

Power consumption is an issue that engineers continuously try to improve on. Improvements could be made with respect to reducing power consumption of a DAC.

BRIEF DESCRIPTION OF THE DRAWINGS

FIGS. 4A-4C illustrate spectra of the noise-shaped modulator output, the MSN's and the LSB's, respectively, of the DAC of FIG. 3;

DESCRIPTION OF EXAMPLE EMBODIMENTS OF THE DISCLOSURE

Overview

Figure 1:
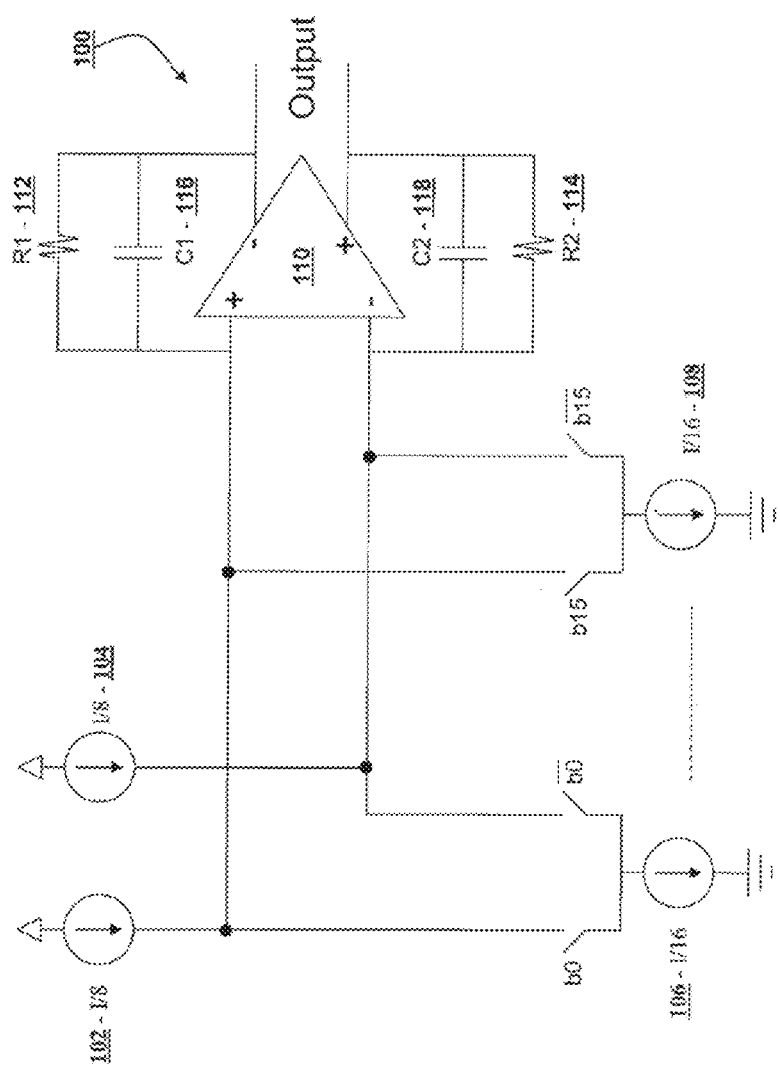
FIG. 1 illustrates a schematic diagram of an exemplary 16-bit, two-level logic thermometer code current steering DAC.

Techniques described herein operate in context of oversampling DACs, such as e.g. multi-bit sigma-delta DACs, which implement noise-shaped segmentation algorithms. In general, "noise-shaped segmentation," sometimes interchangeably referred to as "noise-shaped splitting," refers to constructing two or more noise-shaped signals whose sum equals the original signal, at least in the baseband sense. In DACs, noise-shaped segmentation divides relatively wide data words of the original digital signal into two or more sub-words which are less wide than the data words of the original signal and which, therefore, may be more suitable for application of dynamic element matching (DEM) logic. The two or more sub-words segmented (i.e. split out) from each data word of the original signal should add up to the data word of the original signal (at least in the baseband sense). When noise-shaped segmentation is implemented, the individual sub-words segmented from a single original word are processed, typically in parallel, by different respective groups of DACs. A group of a plurality of DAC cells converting an individual sub-word split out from a single original word in accordance with noise-shaped segmentation (i.e. as a result of applying a particular noise-shaped segmentation algorithm) is referred to in the following as a "sub-word DAC group" or a "noise-shaped segmentation sub-word DAC group".

Embodiments of the present disclosure provide mechanisms for reducing power consumption in oversampling DACs which implement noise-shaped splitting by either switching one or more sub-word DAC groups off (in case of three-level DAC cells) or by maintaining DAC cells of each such sub-word DAC group either in +1 or −1 state (in case of two-level DAC cells) to cause a zero output. Mechanisms described herein may be applicable to current steering as well as switched capacitor oversampling DACs. Some of the mechanisms described herein may be especially attractive for oversampling sigma-delta audio/video DAC applications. Furthermore, although the mechanisms described herein may provide greater power savings for three-level DACs, these mechanisms are applicable to two-level DACs as well.

As used herein, the term "DAC cell," sometimes also referred to as "DAC unit" or a "DAC element," refers to an analog element such as a current source or a switched capacitor element that delivers an analog quantity such as charge or current. For example, in context of a two-level current steering DAC, a DAC cell may comprise a DAC element that includes two current sources, e.g. a pMOS and an nMOS current sources, as well as two switching mechanisms referred to herein as "switches" b and b_bar, associated with each of the two current sources (i.e. in total of four switches per DAC cell). In another example, in context of a three-level current steering DAC, a DAC cell may comprise a DAC element that includes two current sources, e.g. a pMOS and an nMOS current sources, as well as three switching mechanisms referred to herein as "switches" b, b_bar, and z, associated with each of the two current sources (i.e. in total of six switches per DAC cell). In another context, a DAC cell is an element that can deliver a charge Q equal to the product of a pre-defined reference voltage Vref and a capacitance C. The polarity of this charge is defined by the digital input to the DAC cell.

One aspect of the present disclose provides a method for for controlling application of one or more noise-shaped segmentation techniques for splitting input words of a digital input signal provided or to be provided to a DAC into a plurality sub-words, the DAC comprising a plurality of sub-word DAC groups, where each sub-word DAC group is configured to convert a different sub-word of the plurality of sub-words split from each input word. The method includes determining a range of amplitudes of at least a portion of the input signal, selecting one or more sub-word DAC groups of the plurality of sub-word DAC groups for conversion of the portion of the input signal, the selected one or more sub-word DAC groups corresponding to the determined range of amplitudes of the portion of the input signal, and limiting the conversion of the portion of the input signal to using the selected one or more sub-word DAC groups.

Because mechanisms described herein involve implementing noise-shaped segmentation techniques which depend on the envelope of the incoming digital signal to be converted, these mechanisms may be referred to as "envelope-dependent noise-shaped segmentation" mechanisms.

As will be appreciated by one skilled in the art, aspects of the present disclosure, in particular the envelope-dependent noise-shaped segmentation mechanisms described herein, may be embodied in various manners—e.g. as a method, a system, a computer program product, or a computer-readable storage medium. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Functions described in this disclosure may be implemented as an algorithm executed by one or more processing units, e.g. one or more microprocessors, of one or more computers. In various embodiments, different steps and portions of the steps of each of the methods described herein may be performed by different processing units. Furthermore, aspects of the present disclosure may take the form of a computer program product embodied in one or more computer readable medium(s), preferably non-transitory, having computer readable program code embodied, e.g., stored, thereon. In various embodiments, such a computer program may, for example, be downloaded (updated) to the existing devices and systems (e.g. to the existing DACs or DAC controllers, etc.) or be stored upon manufacturing of these devices and systems.

Other features and advantages of the disclosure are apparent from the following description, and from the claims.

Basics of DACs

A DAC is a device that produces a quantized (discrete step) analog output in response to a binary digital input code. The digital input may be e.g. input from transistor logic (TTL), emitter-coupled logic (ECL), complementary metal-oxide-semiconductor (CMOS) circuits, or low-voltage differential signaling (LVDS), while the analog output may be either a voltage or a current. To generate the output, a reference quantity (either a voltage or a current) is divided into binary and/or linear fractions. Then the digital input drives switches to the individual DAC cells of a DAC, which could comprise current sources, voltage sources, resistors, capacitors, etc. An output is produced by combining an appropriate number of these fractions, a process sometimes referred to as "encoding." The number and size of the fractions reflect the number of possible digital input codes, which is a function of converter resolution or the number of bits (N) in the digital input code. For example, N bits could result in $2^N$ possible codes (if thermometer code is used for encoding).

In a DAC, a digital signal is provided to a coding element (encoder) which, in turn, switches the individual DAC cells on and off to convert digital input values of the digital signal to analog values. The number of DAC cells switched on at the same time represents an analog value of the resulting analog signal at that time.

For example, a DAC with 15 DAC cells is capable of converting a 4-bit digital value (i.e., N=4) to one of 16 different analog values ($2^N$, so for N=4 the number of possible codes is $2^4$=16) by switching the appropriate DAC cells on. For example, to convert a digital value 0110 to an analog value—six DAC cells may be switched on, to convert a digital value 0111 to an analog value—seven DAC cells may be switched on, to convert a digital value 1001 to an analog value—nine DAC cells may be switched on, to convert a digital value 1011 to an analog value—eleven DAC cells may be switched on, and so on.

DACs may be differentiated based on modulation schemes applied. Two modulation schemes often used to implement DACs are sigma-delta (sometimes also referred to as "delta-sigma") and Nyquist-rate (or simply "Nyquist").

DACs may also be differentiated based on circuit architecture used. Two circuit architectures often used to implement DACs are current steering DACs and switched capacitor DACs. "Current steering DACs" refer to DACs where current sources of the DAC cells are steered to generate an analog current output. "Switched capacitor DACs" refer to DACs where capacitors of the DAC cells are connected to different reference voltages to generate an analog voltage output.

Current steering DACs may be implemented as two-level or three-level DACs, described in greater detail below.

Two-Level Vs Three-Level Current Steering DACs

Current steering architecture is a commonly used approach in industry to realize DACs. Due to its simplicity and flexibility, this architecture is employed in a large combination of high speed or high resolution applications, often in context of sigma-delta DACs.

Current steering DACs may be implemented either as two-level DACs or three-level DACs. As known in the art, the term "two-level DAC" refers to a DAC comprising DAC cells that respond to 1 and 0 digital input values (i.e., two levels of digital input), while the term "three-level DAC" refers to a DAC comprising DAC cells that respond to +1, 0, and −1 digital input values (i.e., three levels of digital input).

FIG. 1 illustrates a typical implementation of a 16-bit thermometer-code two-level current steering DAC 100. The DAC consists of a bank of current steering cells 102, 104, 106, and 108, amplifier 110, a pair of feedback resistors 112 and 114, and in some cases a pair of capacitors, C1 116 and C2 118. Capacitors 116 and 118 effectively slow down the step output waveform to help reduce the amplifier slew rate requirement. The control bits and their complementary version are, in the simplest form, the Q and QB outputs of a D-flip flop array. The inputs of these D-flip flops are the digital DAC codes. The circuit operation is quite simple in that the digital codes control how many cells will be directed to the appropriate summing junction of the amplifier. A clock which defines the conversion rate of the DAC is used to synchronize all output transitions of the control bits via the D-flip flops.

Referring to FIG. 1 described above, one drawback of conventional thermometer-code current steering two-level DACs is thermal noise performance. In particular, when data is zero, half of the switching current sources may be connected to one summing junction, and the other half may be connected to the other summing junction of the I-to-V converter. Moreover, the top current sources may be always connected to the summing junctions. The current sources are the dominant thermal noise source in the DAC output and dictate the signal to noise ratio (SNR) of the converter.

Figure 2:
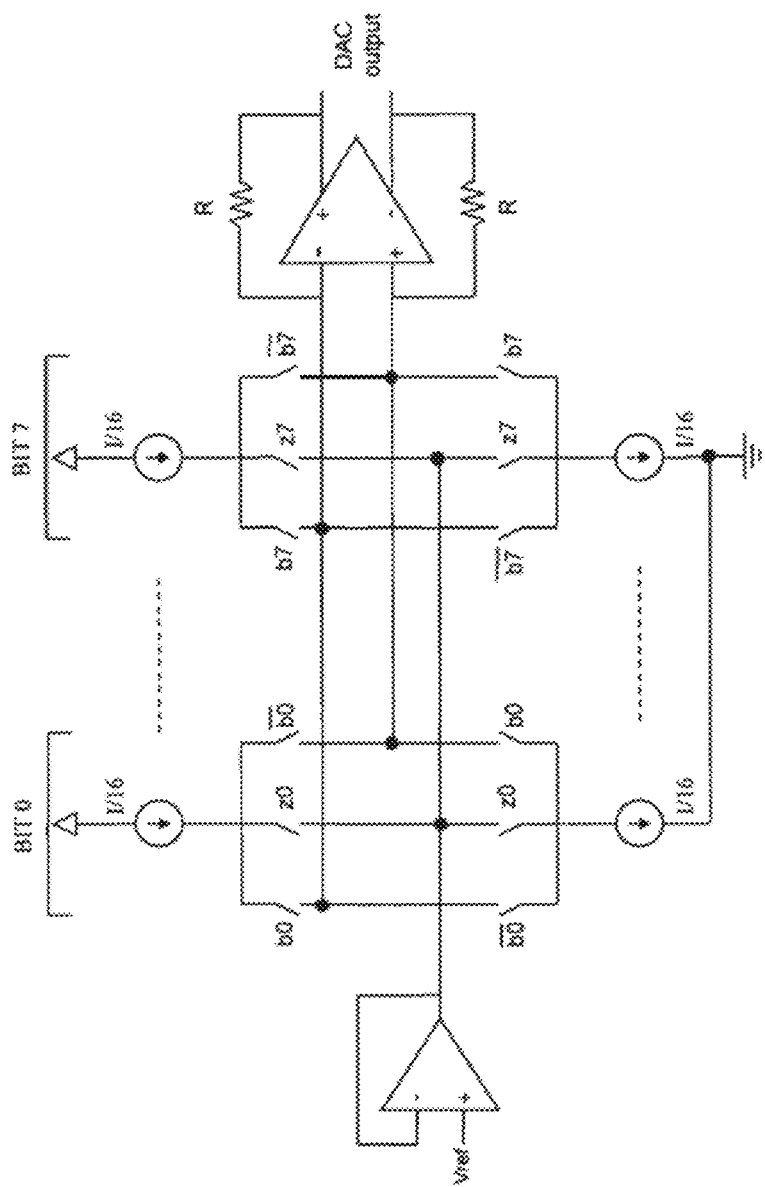
FIG. 2 illustrates a schematic diagram of an exemplary 8-bit, three-level logic thermometer code current steering DAC.

One technique previously used to overcome the above-discussed thermal noise problem is based on employing three-level logic thermometer current steering DAC cells, each including a pair of current sources (positive and negative) and 3 switches per each current source, the switches referred to herein as switches b, b_bar, and z. Such DAC cells are shown in the example of FIG. 2, illustrating eight three-level current steering DAC cells denoted as bits 0-7. Because, typically, A DAC employs multiple DAC cells, e.g. 16 DAC cells in the example of FIG. 1 or 8 DAC cells in the example of FIG. 2, the switches of a particular DAC cells are denoted in the FIGUREs with reference numbers indicating the DAC cell, e.g. a switch b of a DAC cell indicated as "cell 0" in FIG. 1 or of a DAC cell indicated as "bit 0" (the terms "bit" and "cell" being used interchangeably) in FIG. 2 is shown as a switch b0, a switch b of a DAC cell indicated as "cell 15" in FIG. 1 is shown as a switch b15, and so on.

For each three-level DAC cell (e.g. each of the bits 0-7 shown in FIG. 2), when a digital value of 1 is converted, switch b is closed while switches b_bar and z are open; when a digital value of −1 is converted, switch b_bar is closed while switches b and z are open; and, when a digital value of 0 is converted, switch z is closed while switches b and b_bar are open.

Since each pair of current sources may be connected to the summing junction in three different ways, each pair may contribute a positive quantity of charge, a negative quantity of charge, or nothing at all. When the data is zero, all the current sources are connected to a buffer amplifier to maintain their proper drain voltage. Thereby, the main noise source is from the amplifier, which by design is much smaller than that of the current sources. Hence, the SNR may be significantly improved, compared to the two-level current steering DACs.

Limitations on DAC Performance

Analog signals are continuous time-domain signals with infinite resolution and possibly infinite bandwidth. However, the DAC's output is a signal constructed from discrete values (quantization) generated at uniform, but finite, time intervals (sampling). In other words, the DAC output attempts to represent an analog signal with one that features finite resolution and bandwidth. Quantization and sampling impose fundamental, yet predictable, limits on DAC performance. Quantization determines the maximum dynamic range of the converter and results in quantization error or noise in the output. Sampling determines the maximum bandwidth of the DAC output signal according to Nyquist criteria. The Nyquist theory states that the signal frequency (that is, the DAC output) must be less than or equal to one-half the sampling frequency to prevent sampling images from occurring in the frequency band of the DAC output.

In addition, DAC operation is also affected by non-ideal effects beyond those dictated by quantization and sampling. One such effect is component mismatch (i.e. mismatch between the DAC cells of a DAC) relating to variation in component values attributable to e.g. variations arising from the manufacturing process or thermal drift during operation of a device. Component mismatch leads to noise (mismatch errors), which may, in turn, lead to nonlinear behavior of DACs. Mismatch becomes especially pronounced for the most significant bit (MSB) components in case segmented DACs are used where the full resolution of the converter is spread across two or more sub-DACs, because unit values are larger there and generate more current or voltage at the output than the least significant bit (LSB) components.

Mismatch errors may be characterized by a number of static and dynamic performance specifications or parameters that determine converter's static and dynamic performance, such as e.g. spurious-free dynamic range (SFDR), representing the strength ratio of the fundamental signal to the strongest spurious signal in the output, and noise spectral density (NSD), representing the noise power per unit of bandwidth. These parameters are, therefore, important in choosing a suitable approach for mismatch compensation.

One approach for addressing component mismatch is to impose more stringent tolerances on manufacturing of components. However, this approach tends to decrease yield and therefore increases costs of unit components.

Other approaches include using one of dynamic element matching (DEM) techniques, described in greater detail below.

Dynamic element matching (DEM) is a class of techniques used in integrated circuits (IC) design to compensate for the component mismatch. DEM techniques typically involve some kind of a dynamic process intended to reduce the effects of component mismatches in electronic circuits by dynamically re-arranging the interconnections of mismatched components so that the time averages of the equivalent components at each of the component positions are equal or nearly equal.

One DEM technique, conventionally referred to as "random scrambling DEM," is based on randomizing which DAC cells are turned on for converting each digital value. When random scrambling DEM is used, then, instead of switching consecutive DAC cells at each point in time (i.e. to convert each digital value), the same number of non-consecutive, randomly selected DAC cells are switched on. Other known DEM methods include e.g. Data Weighted Averaging (DWA) and its variations, vector feedback, and tree structure.

Many known DEM techniques suffer from a drawback where the application of a DEM technique results in unpredictable and uncontrolled pseudo-periodic behavior of the analog output signal. This behavior manifests itself in appearance of tones, i.e. undesired artifacts appearing in the spectrum of an output signal which were not present in the input signal. In sigma-delta DACs, these tones are referred to as "idle tones" and are one of the most commonly encountered effects of non-linearity. It would be desirable to improve on this issue.

Furthermore, since power consumption is an issue that engineers continuously try to improve on, it would be desirable to reduce power consumption of a DAC, and in particular to reduce power consumption of a DAC in context of application of various DEM techniques.

Noise-Shaped Segmentation

To achieve the desired low out-of-band noise energy in DAC output without using expensive post-analog filter and to increase the signal-to-noise ratio (SNR) of a DAC, a digital modulator used in a DAC needs to have high enough output resolution, i.e. a relatively wide word-width. However, this causes the required circuit area and power consumption to increase significantly (for a conversion of an N-bit input word using thermometer code, $2^N$ DAC cells are needed), rendering conventional wide word-width digital modulators impractical.

Figure 3:
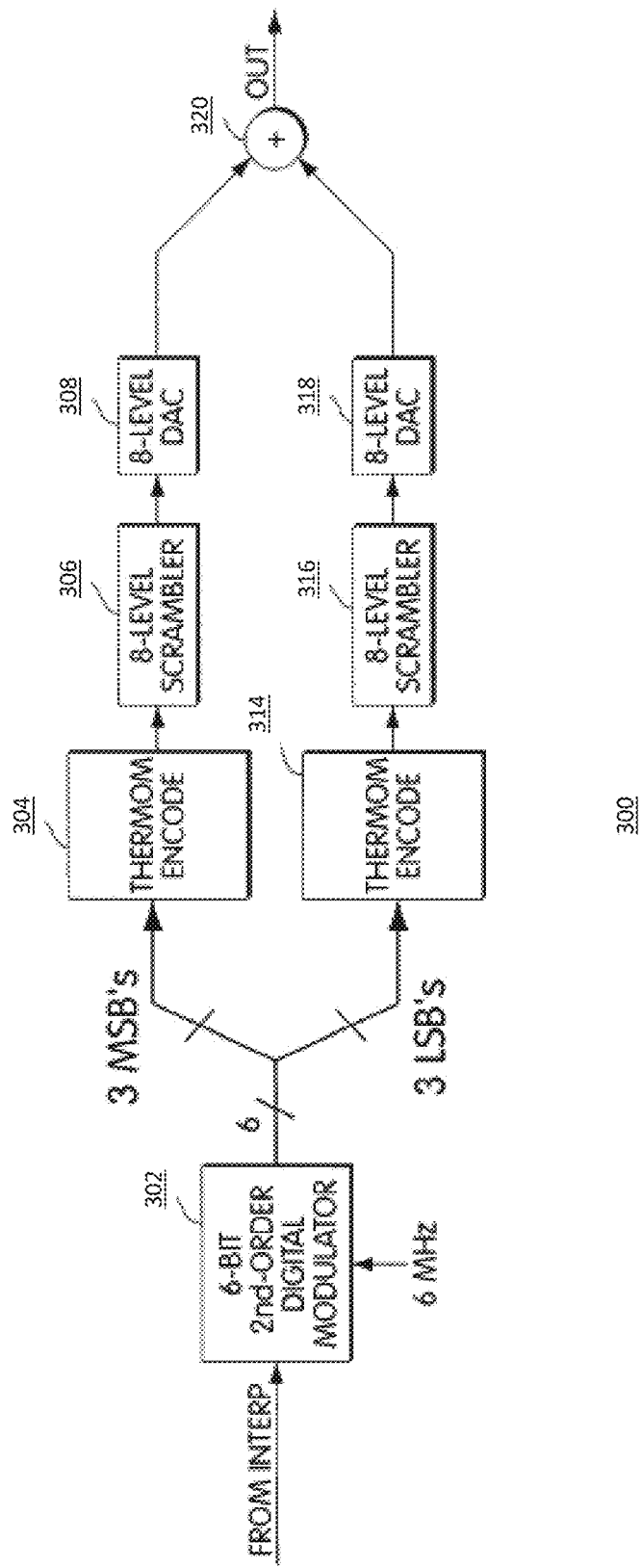
FIG. 3 illustrates a schematic diagram of an exemplary DAC utilizing simple bit segmentation of the digital modulator output.

The number of analog elements (DAC cells) may be reduced by using two or more sub-DACs instead of a single DAC with $2^N$ levels. Each sub-DAC has its own thermometer encoder, and the analog weights for each sub-DAC are different, as shown in the example of a system 300 illustrated in FIG. 3. As shown in FIG. 3, a 6-bit word from a digital modulator 302 may be split into the three most significant bits (MSBs) and the three least significant bits (LSBs). The three MSBs are converted by a thermometer encoder 304 into 8 equally-weighted bits ($2^3=8$, where 3 is the number of MSBs), which pass through a scrambler 306 and drive an 8-level DAC 308. The three LSBs are converted by a thermometer encoder 314 into 8 equally-weighted bits ($2^3=8$, where 3 is the number of LSBs), which pass through a scrambler 316 and drive an 8-level DAC 318.

The thermometer encoder in combination with a scrambler, e.g. a combination of the encoder 304 and the scrambler 306 or a combination of the encoder 314 and the scrambler 316 implement a digital encoder that employs a random scrambling DEM, described above, the purpose of which is to scramble the DAC noise by randomly selecting the DAC cells of their respective DACs (i.e. the DAC 308 for the former combination and the DAC 318 for the latter combination) such that the error in the analog output of the DAC is white and uncorrelated with the digital input x[n]. As a result of implementing random scrambling DEM, the DAC noise may be randomly modulated without modulating the signal component of the DAC output, thus effectively converting the harmonic distortion, i.e. spurious tones, into white noise.

The analog outputs of DAC 308 and DAC 318 are supplied to a summing circuit 320. The output of the DAC 318 has bit weights of K, while the output of the DAC 308 has bit weights of 8xK. The output of the summing circuit 320 is an analog value that equals the 6-bit digital input word. Only 16 analog elements are required to covert a 6-bit input word ($2^3=8$ to covert the 3 MSB's and $2^3=8$ to covert the 3 LSB's), as compared with 64 elements ($2^6=64$) required in a converter that does not do such splitting into sub-words.

Unfortunately, the circuit of FIG. 3 has a major flaw. While errors in the DACs 308 and 318 are noise-shaped as a result of using the scramblers 306 and 316, errors that result from gain mismatches between the two DACs are not noise-shaped and therefore produce in-band noise. This may be explained as follows. The spectrum of the 6-bit word output by digital modulator 302 is noise-shaped, as shown in FIG. 4A. When this 6-bit word is split into the three MSBs and the three LSBs, the spectrum of each of the three-bit words is not noise-shaped, but is likely to be a combination of distortion and white noise, as shown in FIGS. 4B and 4C. With no analog mismatch errors, the sum of the two 3-bit words is equal to the original 6-bit word, which is again noise-shaped. However, in the presence of gain errors between the two 8-level DACs 308 and 318, the spectrum of the error that results from this gain mismatch is simply the spectrum of each of the individual 3-bit words, which is not noise-shaped.

In order to overcome this problem, the original noise-shaped word output by digital modulator 302 may be split, or segmented, into two components with smaller word lengths, where the two components meet the following criteria: (a) the sum of the two components must be equal to the original noise-shaped word; and (b) the spectrum of at least one of the components must be noise-shaped, so that in the presence of gain errors between the two DACs, the error is also noise-shaped.

Figure 5:
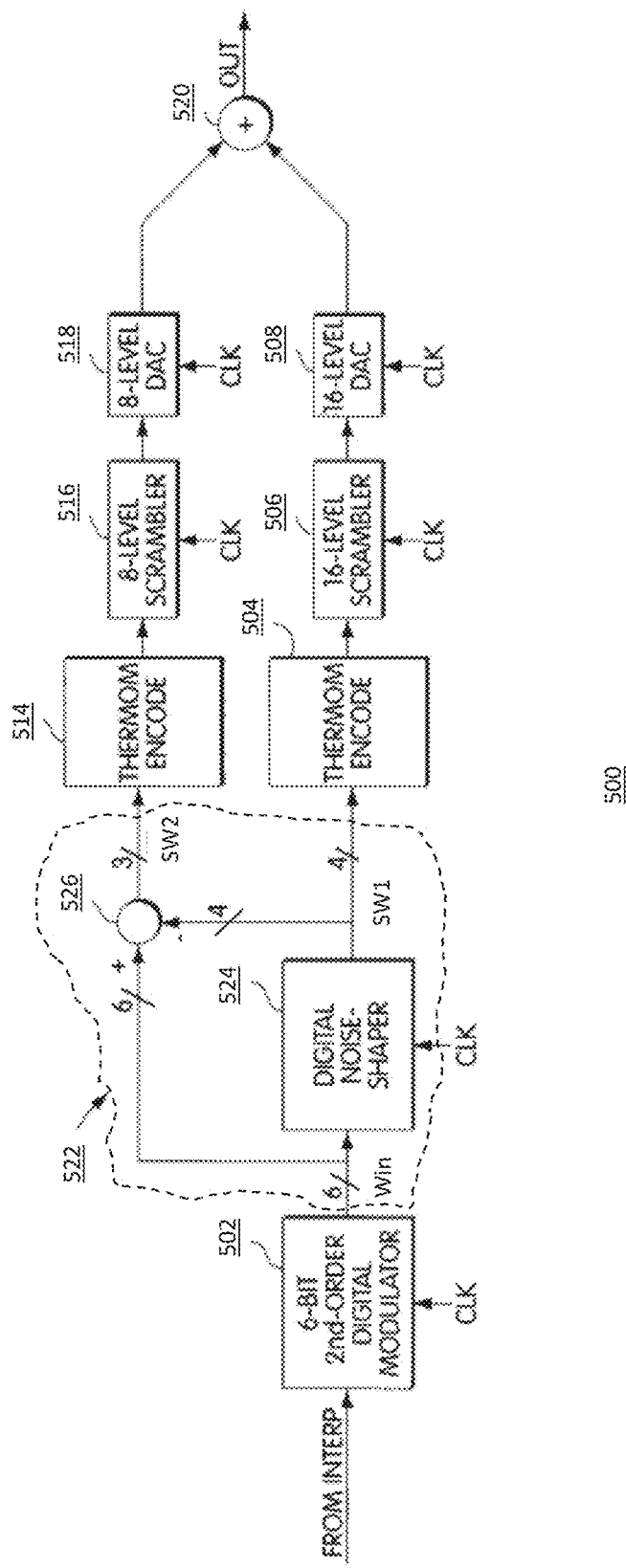
FIG. 5 illustrates a schematic diagram of an exemplary DAC system utilizing noise-shaped segmentation of the digital modulator output, according to some embodiments of the disclosure.

A block diagram of a DAC that meets the above requirements is shown with a system 500 of FIG. 5. The output of a digital modulator 502, a noise-shaped digital input word 'Win' is applied to a segmentation circuit 522 (indicated in FIG. 5 with a dashed line), including a digital noise shaper 524 and a subtractor 526, that splits, or segments, the digital input word Win into sub-words SW1 and SW2. The digital input words Win are applied to the digital noise-shaper 524, which reduces the word length of the input words Win and produces noise-shaped digital sub-words SW1. The error introduced by the word length reduction is noise-shaped rather than white. A second digital sub-word SW2 is produced by subtracting sub-word SW1 from the input word Win in the subtractor 526. The sub-word SW2 equals Win-SW1, and SW1+SW2=Win. In the particular example of FIG. 5, the digital sub-word SW1 is MSB aligned with the digital input word Win in the subtractor 526, with the two low order bits of the sub-word SW1 input to the subtractor 526 set to logic zero. Since the sub-word SW1 tracks the input word Win, the sub-word SW2 is small and has fewer bits than the original input word Win. Since input words Win are noise-shaped, sub-words SW1 and SW2 are noise-shaped. Therefore, the circuit of FIG. 5 meets the requirements specified above. The sub-words SW1 and SW2 are both noise-shaped and have smaller word lengths than input word Win, and their sum equals the original input word Win.

Referring again to FIG. 5, the sub-word SW1 may be applied to a thermometer encoder 504, and the sub-word SW2 may be applied to a thermometer encoder 514. In the example of a 6-bit input word Win, sub-word SW1 has 4 bits and sub-word SW2 has 3 bits, as described below. Thus, the thermometer encoder 504 supplies 16 equally-weighted bits ($2^4=16$) to a 16-level scrambler 506, and the thermometer encoder 514 supplies eight equally-weighted bits ($2^3=8$) to an 8-level scrambler 516. The scrambled bits output by the scrambler 506 are applied to a 16-level DAC 508, and the scrambled bits output by the scrambler 516 are supplied to an 8-level DAC 518. The analog outputs of the DAC 508 and the DAC 518 are supplied to a summing circuit 520. The output of the DAC 518 has bit weights of K, while the output of the DAC 508 has bit weights of 4xK. The output of the summing circuit 520 has an analog value that represents the input digital word Win. Additional details regarding the structure and operation of the thermometer encoder and the scrambler are provided in U.S. Pat. No. 5,404,142 "Data-directed scrambler for multi-bit noise shaping D/A converters", which is hereby incorporated by reference.

The segmentation circuit 522, including the digital noise-shaper 524 and the subtractor 526, thus receives digital input words Win and produces sub-words SW1 and SW2. The sub-words SW1 and SW2 have smaller word lengths than the input word Win. The sum of the sub-words SW1 and SW2 is equal to the input word Win. When input words Win are noise-shaped, sub-words SW1 and SW2 are also noise-shaped. It will be understood that the segmentation circuit such as the one shown in FIG. 5, as well as segmentation circuits shown in other drawings of the present disclosure, may be configured for operation with any input word length. Thus, the input word length may be more than 6 bits or less than 6 bits. The word lengths of sub-words SW1 and SW2 would depend on the application, but, in some embodiments, sub-words SW1 and SW2 preferably have approximately equal word lengths in order to minimize circuit area. The relative bit weights of the DACs 508 and 518, in general, would depend on the word lengths of input words Win and sub-words SW1. Where the input word Win has J bits and sub-word SW1 has K bits, the DAC 508 has bit weights of $2^{J-K}$ relative to the DAC 518.

In the case shown in FIG. 5 and described above, input words Win are noise-shaped, and sub-words SW1 and SW2 are also noise-shaped. In a second case within the scope of the present disclosure, input words Win are not noise-shaped, and, as a result, sub-words SW2 (equal to the error between the input word Win and the sub-word SW1) are noise-shaped and sub-words SW1 are not noise-shaped. In each case, the error that results from gain mismatch between the DACs 508 and 518 is noise-shaped. Thus, the segmentation circuit 522 produces the desired result whether or not the input words Win are noise-shaped.

The sub-word SW2 is formed by subtracting the sub-word SW1 from the input word Win, with the sub-word SW1 MSB aligned with the input word Win. The word length of the sub-word SW2 is found to be 3 bits in the example where the input word Win has 6 bits and sub-word SW1 has 4 bits. Thus, a 6-bit input word is split into a 4-bit noise-shaped sub-word SW1 and a 3-bit noise-shaped sub-word SW2. The fact that the total number of bits at the output is one greater than the total number of input bits means that there is overlap between the least significant DAC 518 and the most significant DAC 508. The full scale range of the least significant DAC 518 is twice the value of the LSB of the most significant DAC 508. This occurs because the noise-shaper 524 that receives the input word Win and produces sub-word SW1 introduces noise-shaped errors up to ±four LSBs of the original input word Win. When sub-word SW1 is then subtracted from input word Win, one bit of word growth occurs during the subtraction that would not occur if the sub-word SW1 were simply the 4 high order bits of the input word Win. In other words, the penalty that is paid for insisting that sub-words SW1 and SW2 be individually noise-shaped is that there is one bit of word growth in sub-word SW2.

Even with this word growth, the reduction in the number of scrambling elements and the reduction of the total number of DAC cells employed is substantial. Using prior art implementations without segmentation (not shown in FIGURES), the number of scrambler elements for a 6-bit input word is 192. The total number of scrambler elements for the configuration of FIG. 5 could be reduced to 44. Thus, the number of required scrambler elements is reduced by a factor of more than four.

In the example of FIG. 5, the input word Win is split into two noise-shaped sub-words. For large input words, it may be advantageous to split the input word into more than two sub-words using a tree structure, as shown with a system 600 shown in FIG. 6. The process of segmenting a digital word into two smaller noise-shaped sub-words is repeated in the tree structure, illustrated in FIG. 6 with two stacked segmentation circuits 622-1 and 622-1. Each of the segmentation circuits 622-1 and 622-2 operates substantially as described above for the segmentation circuit 522 shown in FIG. 2, where first-order modulators 624-1 and 624-2 of the first and second segmentation circuits 622-1 and 622-2, respectively, are similar to the digital noise-shaper 524 shown in FIG. 5 and where subtractors 626-1 and 626-2 are similar to the subtractor 526 shown in FIG. 5. Since descriptions of the segmentation circuit 522 shown in FIG. 5 apply to the segmentation circuits 622 shown in FIG. 6, in the interest of brevity, details of these descriptions are not repeated for FIG. 6.

Figure 6:
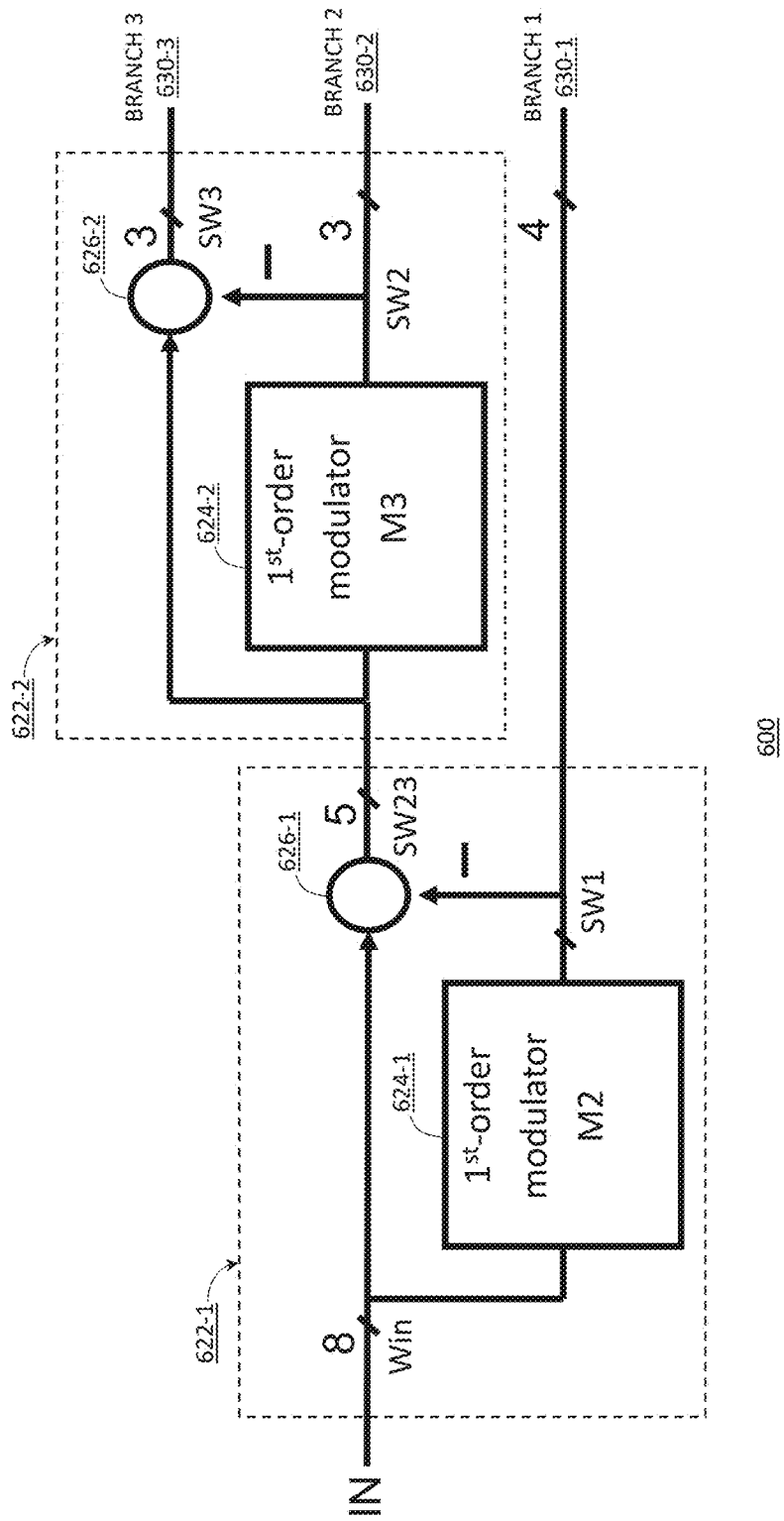
FIG. 6 illustrates a schematic diagram of an exemplary two-level tree structure of a segmentation circuit utilizing noise-shaped segmentation to split a digital input word into three sub-words, according to some embodiments of the disclosure.

A single level of segmentation shown in FIG. 5 results in two branches individually processing the sub-words into which an input word is divided, where the first branch may be viewed as the path for processing sub-words SW1 and comprising the encoder 504, the scrambler 506, and the DAC 508, and the second branch may be viewed as the path for processing sub-words SW2 and comprising the encoder 514, the scrambler 516, and the DAC 518. FIG. 6 illustrates a tree structure with two levels of segmentation, which results in three branches, shown in FIG. 6 as branches 630-1, 630-2, and 630-3, for processing, respectively, sub-words SW1, SW2, and SW3. The first segmentation circuit 622-1 splits the input word Win into a first sub-word, indicated in FIG. 6 as 'SW1,' and a second sub-word, indicated in FIG. 6 as 'SW23,' in a manner similar to how the segmentation circuit of FIG. 5 splits the input word Win into sub-words SW1 and SW2 (thus, Win of FIG. 6 is similar to Win of FIG. 5, SW1 of FIG. 6 is similar to SW1 of FIG. 5, and SW23 of FIG. 6 is similar to SW2 of FIG. 5). The input word from the least significant branch of the first and second branches of the first segmentation circuit 622-1, i.e. the input words SW23, is now provided as an input word to the second segmentation circuit 622-4. In turn, the second segmentation circuit 622-2 splits the input word SW23 into a first sub-word, indicated in FIG. 6 as 'SW2,' and a second sub-word, indicated in FIG. 6 as 'SW3,' in a manner similar to how the segmentation circuit of FIG. 5 splits the input word Win into sub-words SW1 and SW2 (thus, SW23 of FIG. 6 is similar to Win of FIG. 5, SW2 of FIG. 6 is similar to SW1 of FIG. 5, and SW3 of FIG. 6 is similar to SW2 of FIG. 5). In other words, the most significant bit sub-word of the second segmentation circuit 622-2 (i.e. the sub-word that was referred to as "the first sub-word SW1" for the illustration of a single-level noise-shaped segmentation of FIG. 5) becomes the second sub-word SW2 of the overall stacked architecture 600 shown in FIG. 6, and the least significant bit sub-word of the second segmentation circuit 622-2 (i.e. the sub-word that was referred to as "the first sub-word SW2" for the illustration of a single-level noise-shaped segmentation of FIG. 5) becomes the third sub-word SW3 of the overall stacked architecture 600 shown in FIG. 6.

Although not specifically shown in FIG. 6, the sub-words SW1, SW2, and SW3 may be processed, in their respective branches, by an encoder, e.g. a thermometer encoder similar to the encoders 504 and 514 shown for the two branches of FIG. 5, a DEM logic such as e.g. the scramblers 506 and 516 shown for the two branches of FIG. 5, and converted to analog values by a DAC similar to the DACs 508 and 518 shown for the two branches of FIG. 5.

Figure 7:
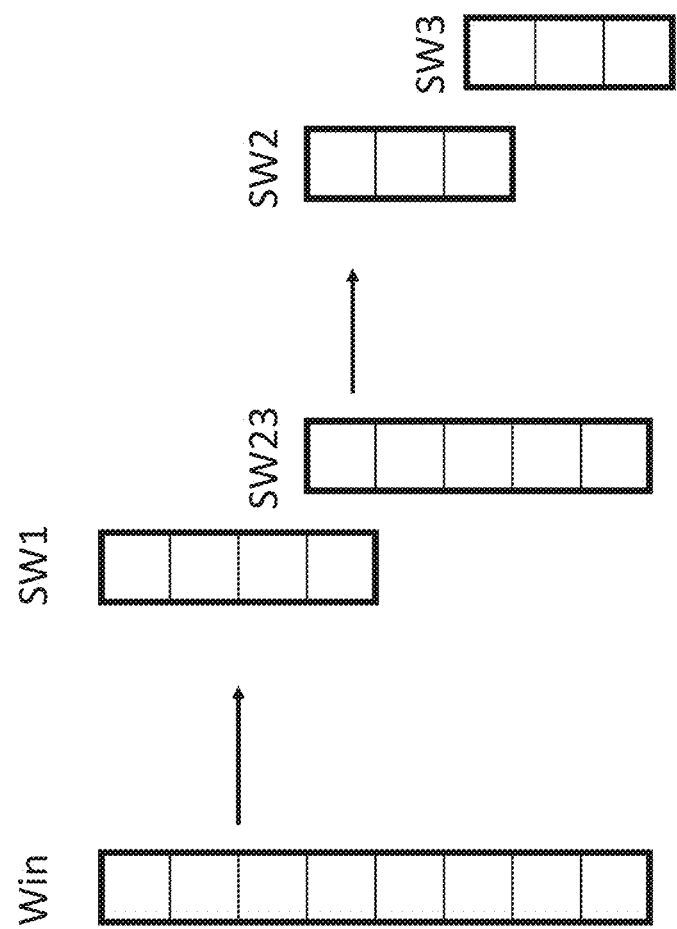
FIG. 7 illustrates division of a digital input word into three sub-words by the segmentation circuit of FIG. 6, according to some embodiments of the disclosure.

FIG. 7 provides a schematic illustration of splitting an input word Win into three sub-words SW1, SW2, and SW3, for the example illustrated in FIG. 6. With reference to FIGS. 6 and 7, the sub-word SW23 is formed in the first segmentation circuit 622-1 by subtracting the sub-word SW1 from the input word Win, with the sub-word SW1 MSB aligned with the input word Win. The word length of the sub-word SW23 is found to be 5 bits in the example where the input word Win has 8 bits and sub-word SW1 has 4 bits. Thus, an 8-bit input word is split into a 4-bit noise-shaped sub-word SW1 and a 5-bit noise-shaped sub-word SW23. The fact that the total number of bits at the output of the first segmentation circuit 622-1 is one greater than the total number of input bits means that there is overlap between the least significant DAC in the second branch 630-2 and the most significant DAC in the first branch 630-1 (the DACs not specifically shown in FIG. 6). Again, the penalty that is paid for insisting that sub-words SW1 and SW23 be individually noise-shaped is that there is one bit of word growth in the sub-word SW23. Similarly, for the second segmentation circuit 622-2 shown in FIG. 6, the sub-word SW3 is formed in the second segmentation circuit 622-2 by subtracting the sub-word SW2 from the input word SW23, with the sub-word SW2 MSB aligned with the input word SW23. The word length of the sub-word SW3 is found to be 3 bits in the example where the input word to the segmentation circuit 622-2, SW23, has 5 bits and the MSB sub-word of the second segmentation circuit, SW2, has 3 bits. Thus, a 5-bit input word provided to the second segmentation circuit 622-2 is split into a 3-bit noise-shaped first sub-word SW2 and a 3-bit noise-shaped second sub-word SW3. Again, the fact that the total number of bits at the output of the second segmentation circuit 622-2 is one greater than the total number of input bits means that there is overlap between the least significant DAC in the third branch 630-3 and the most significant DAC in the second branch 630-2 (the DACs not specifically shown in FIG. 6). Again, the penalty that is paid for insisting that sub-words SW2 and SW3 be individually noise-shaped is that there is one bit of word growth in the sub-word SW3.

As the foregoing illustrates, for the illustration of FIG. 6, SW1+SW2+SW3−=Win and relative LSB position determines the DAC gain of the DAC in each branch, with gain mismatches being spectrally shaped.

While FIG. 6 illustrates a tree structure with two levels of segmentation resulting in three branches as described above, embodiments of the present disclosure are applicable to any one or more levels of segmentation. At every level in the tree structure, the number of bits is reduced according to noise-shaped segmentation principles described above where an input word is split into two sub-words, one of which is the MSB word and the other one is the LSB word with one or more bits overlapping. The final results are supplied to a plurality of sub-DACs and, possibly to respective DEM logic. Additional details regarding the structure and operation of noise-shaped splitting are provided in U.S. Pat. No. 5,977,899 "DIGITAL-TO-ANALOG CONVERTER USING NOISE-SHAPED SEGMENTATION", which is hereby incorporated by reference.

Figure 8:
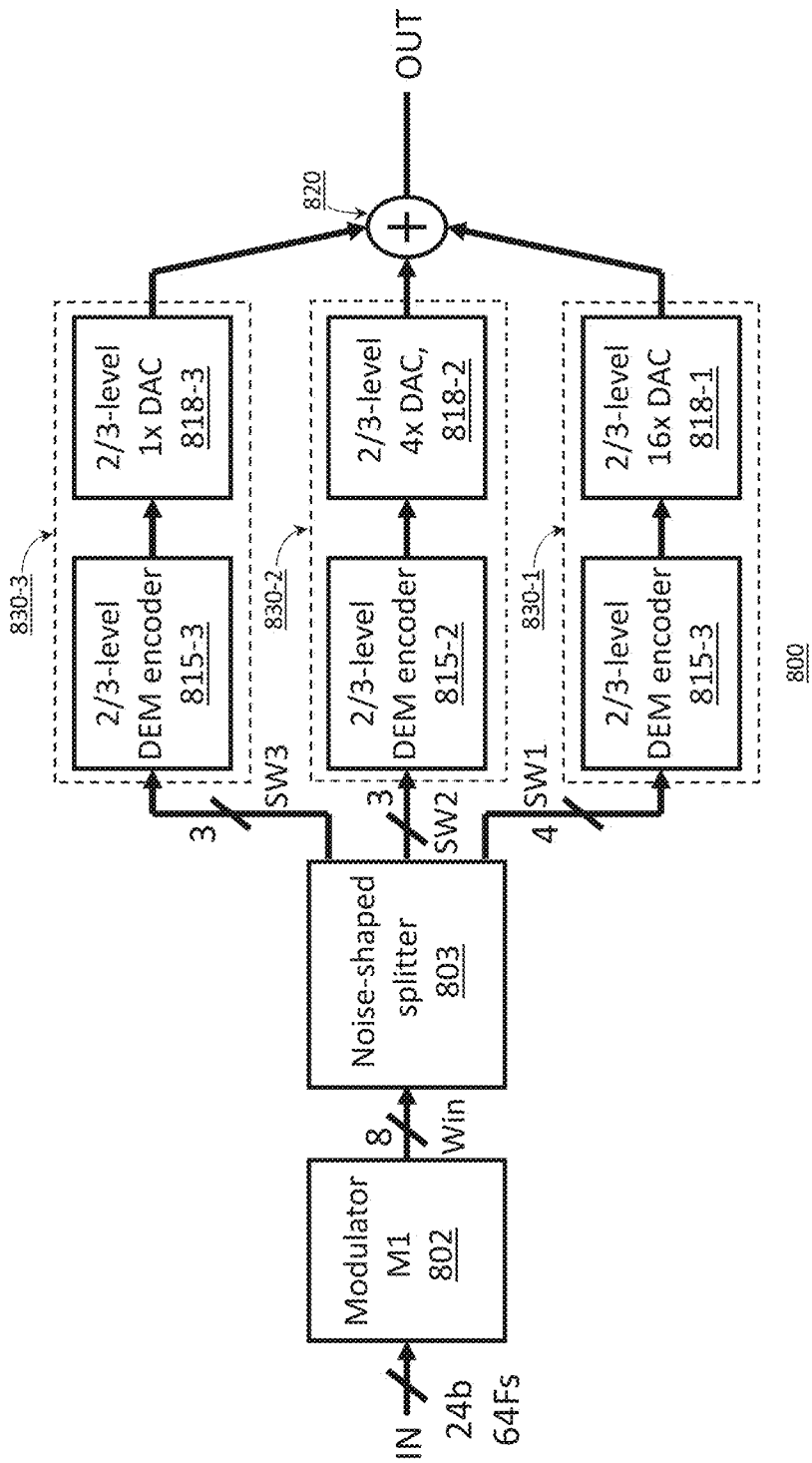
FIG. 8 illustrates a schematic diagram of an exemplary DAC system utilizing the noise-shaped segmentation circuit of FIG. 6 to split a digital input word into three sub-words, according to some embodiments of the disclosure.

FIG. 8 illustrates a schematic diagram of an exemplary DAC system 800 utilizing the noise-shaped segmentation circuit of FIG. 6 to split a digital input word into three sub-words, according to some embodiments of the disclosure. As shown in FIG. 8, a 24-bit input, such as e.g. provided from a CD or a DVD player, may be converted, by a digital modulator M1 802 to an 8-bit input word Win, which may then be split by a noise-shaped splitter 803 into the three noise-shaped sub-words SW1, SW2, and SW3 so that SW1+SW2+SW3=Win. The noise-shaped splitter 803 may be implemented as e.g. the stacked segmentation circuit 600 shown in FIG. 6. Each of the sub-words may then be processed by a respective branch, shown as a first ranch 830-1 for processing/converting the first sub-word SW1, a second branch 830-2 for processing/converting the second sub-word SW2, and a third branch 830-3 for processing/converting the third sub-word SW3. The first, second, and third branches 830 may be similar to the first, second, and third branches 630 indicated in FIG. 6. Each of the branches 830 may include a respective DEM encoder 815 and a respective DAC 818. Each DEM encoder 815 may include e.g. an encoder, e.g. a thermometer encoder similar to the thermometer encoder 404/414 and a DEM logic, e.g. a scrambler similar to the scrambler 406/416 employing a random scrambling DEM, described above. Each DAC 818 is a sub-word DAC group comprising a plurality of DAC cells configured to convert the respective digital sub-word of the branch into an analog output. The analog outputs of the sub-word DAC groups 818 are supplied to a summing circuit 820.

For the example shown in FIG. 8, considering that the output of the DAC 818-3 has bit weights of K, the output of the DAC 818-2 would have bit weights of 4xK, and the output of the DAC 818-1 would have bit weights of 16xK. These weights are determined in accordance with the explanation provided above for the relative bit weights of the DACs 508 and 518. For the two sub-words SW2 and SW3 of the example of FIGS. 6-8, the input word (SW23) has 5 bits and the most significant bit sub-word SW2 has 3 bits, meaning that the DAC 818-2 has bit weights of $2^{5-3}=4$ relative to the DAC 818-3. For the two sub-words SW1 and SW2 of the example of FIGS. 6-8, the input word (Win) has 8 bits and the first sub-word SW1 has 4 bits, meaning that the DAC 818-1 has bit weights of $2^{8-4}=16$ relative to the DAC 818-3.

The output of the summing circuit 820 is an analog value, shown in FIG. 8 as "OUT," that approximates the 8-bit digital input word Win.

For the illustration shown in FIG. 8, only 32 DAC cells are required to covert an 8-bit input word ($2^4=16$ to covert SW1, $2^3=8$ to covert SW2, and another $2^3=8$ to covert SW3), as compared with 256 elements ($2^8=256$) required in a converter that does not do such splitting into sub-words. Similarly, less scramblers are required to implement a random scrambling DEM. While this provides a substantial improvement with respect to the valuable chip area used to implement the DAC cells and the DEM logic, further improvements are always desirable.

Envelope-Dependent Noise-Shaped Segmentation

Embodiments of the present disclosure are based on an insight that further power savings may be achieved for a noise-shaped segmentation system such as e.g. the one shown in FIG. 8 by keeping track of the amplitude of the input digital signal over a certain period of time to determine the range of amplitudes of a portion of the input signal. Embodiments of the present disclosure are based on an insight that tracking the amplitude and controlling the operation of a noise-shaped segmentation circuit based on the tracked amplitude enables implementing DEM techniques, in at least some of the branches processing individual sub-words, which otherwise would not be possible to implement, such as e.g. implementing adaptive length DEM techniques described in co-pending U.S. patent application Ser. No. 14/869,154 "VARIABLE LENGTH DYNAMIC ELEMENT MATCHING IN DIGITAL-TO-ANALOG CONVERTERS," incorporated herein by reference.

In particular, embodiments of the present disclosure include keeping track of the amplitude of the input digital signal over a certain period of time and limiting the number of DAC cells to a number that is necessary for generating the analog output corresponding to the tracked portion of the digital input signal, which number is determined based on the tracked amplitudes and could be smaller than the total number of DAC cells present in a DAC. Whenever possible, unused DAC cells may be put into a power saving mode, providing the advantage of reduced power consumption. Similarly, a particular DEM technique may be applied only to the subset of DAC cells which are selected for converting the digital input word, which allows reducing the mismatch error with smaller input signal amplitudes.

Previous application of noise-shaped segmentation techniques fail to differentiate between different levels of input signal amplitudes. Consequently, power consumption is not optimized. In contrast, embodiments of the present disclosure are based on recognition that, with a smaller subset of DAC cells selected so that the minimum number of DAC cells necessary to correctly represent the input signal or a portion thereof is used, power consumption may be reduced. In addition, when DEM techniques are applied to such a smaller subset of DAC cells, there is less mismatch error. Having a smaller mismatch error means that the idle tone problem or other undesirable consequences of mismatch between DAC cells are less pronounced or may even be sufficiently below the noise floor to be disregarded altogether. Furthermore, applying DEM techniques to a smaller subset of DAC cells reduces processing times and complexity.

Embodiments of the present disclosure are also based on the insight that the rest of the DAC cells, i.e. the DAC cells of the DAC not selected to be used for the conversion and application of DEM techniques for a portion of the input signal currently being processed, could be put into a power saving mode, e.g. be turned off. The latter may be particularly advantageous for three-level DACs because, in such DACs, unused DAC cells still consume relatively significant amount of power by having the z switch closed to represent a zero value and current flowing through the cells. Preventing the current from flowing through the unused DAC cells by turning such DAC cells completely off, e.g. by switching the current sources of those DAC cells off or/and opening all switches of such DAC cells so that the cells are not shunted, allows reducing power consumption of the DAC.

The improved envelope-dependent noise-shaped segmentation methods will now be described with references to FIGS. 9-16.

Figure 9:
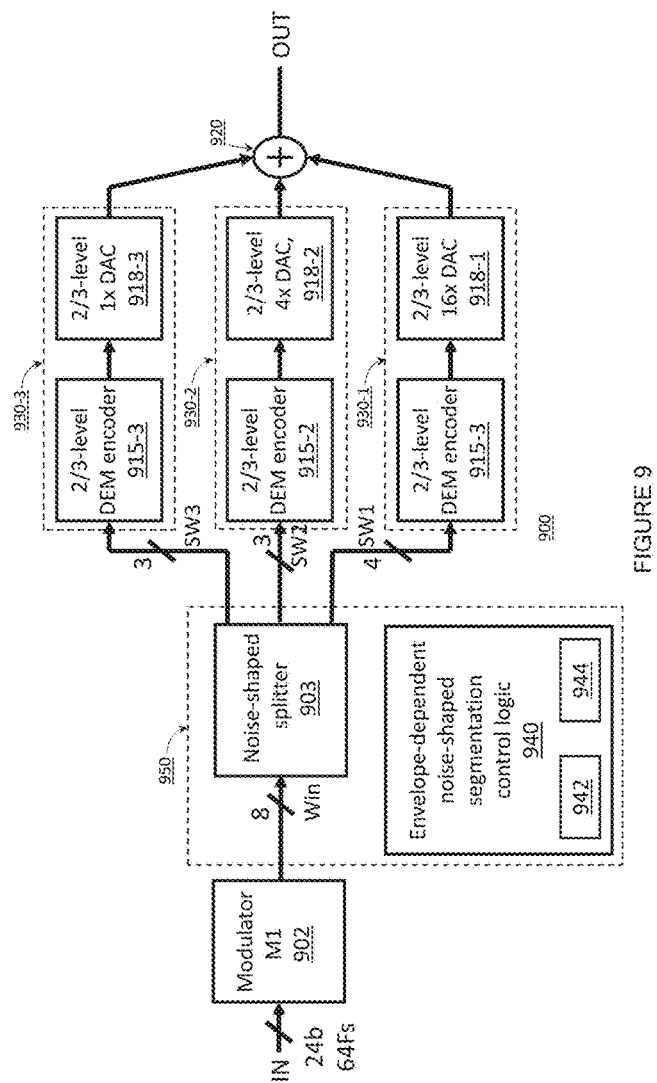
FIG. 9 illustrates a schematic diagram of an exemplary DAC system utilizing a noise-shaped segmentation circuit controlled according to an envelope-dependent noise-shaped segmentation method, according to some embodiments of the disclosure.

FIG. 9 illustrates a schematic diagram of an exemplary DAC system 900 utilizing a noise-shaped segmentation circuit 903 controlled according to an envelope-dependent noise-shaped segmentation method, according to some embodiments of the disclosure. The illustration of FIG. 9 is similar to that of FIG. 8 in that it shows an example in which an 8-bit wide digital input word Win may be split into three sub-words SW1, SW2, and SW3 which are, respectively, 4-, 3-, and 3-bit wide. However, as described above in context of FIG. 8, teachings provided with respect to FIG. 9 are easily applicable to digital input words of any width being split according to noise-shaped segmentation techniques described herein into any number of two or more sub-words. Similar reference numerals shown in FIG. 9 are intended to illustrate similar elements shown in FIG. 8 (as well as in the preceding figures illustrating details of noise-shaped segmentation). Therefore, their description is applicable to the system of FIG. 9 unless otherwise specified and, in the interests of brevity, is not repeated in detail. Instead, the differences with respect to the system of FIG. 8 are described.

As shown in FIG. 9, the DAC system 900 includes a plurality of sub-word DAC groups, indicated as sub-word DAC groups 918-1 through 918-3. In general, any number N of sub-word DAC groups 918 may be used, where N is an integer greater than 1, each sub-word DAC group configured to convert a respective different sub-word noise-shaped split from the input word Win so that $SW_1 + \ldots + SW_N =$ Win. Each sub-word DAC group is implemented in a respective branch according with the principles of noise-shaped segmentation as described above. Thus, in general, N branches may be implemented.

Each sub-word DAC group 918 comprises a plurality of DAC cells, which could be either 2-level DAC cells or 3-level DAC cells described above, the minimum number of the DAC cells in each group defined by, at least, the bit width of the sub-word that each DAC group is designed to convert and by the type of encoding used. As previously described herein, for thermally coded digital words of N bits, $2^N$ DAC cells could be used.

Each DEM encoder 915 may comprise an encoder implementing any of the suitable DEM techniques, such as e.g. variable length DEM as described in co-pending U.S. patent application Ser. No. 14/869,154, random scrambling DEM, DWA and its variations, vector feedback, tree structure, etc.

The DEM encoders 915 may be particularly adapted for use with 2-level or 3-level DAC cells, depending on whether the sub-word DAC groups implement, respectively, 2-level or 3-level cells.

The noise-shaped splitter 903, which could be implemented similar to the noise-shaped splitter 803 of FIG. 8, is configured to receive input digital words Win. Having gone through the noise-shaped segmentation in the splitter 903, noise shaped sub-words are provided to selected sub-word DAC groups 918 for conversion to corresponding output analog values which may be generated by each of the sub-word DAC groups and which are added together by a summing circuit 920, similar to the summing circuit 820 of FIG. 8, to produce an analog output value "OUT".

As also shown in FIG. 9, in contrast to the configuration of FIG. 8, the DAC 900 may further include an envelope-dependent noise-shaped segmentation control logic, or simply a "controller," 940 configured to implement improved envelope-dependent noise-shaped segmentation methods for controlling the application of noise-shaped segmentation methods, and possibly to control application of one or more DEM techniques as described herein. To that end, in some embodiments, the controller 940 may include at least one processor 942 and at least one memory element 944, along with any other suitable hardware and/or software to enable its intended functionality for controlling the application of one or more noise-shaped segmentation techniques, and possibly the application of DEM techniques, as described herein.

The memory 944 may include any of the devices suitable for keeping information in any suitable memory element [e.g., random access memory (RAM), read only memory (ROM), an erasable programmable read only memory (EPROM), application specific integrated circuit (ASIC), etc.], software, hardware, or in any other suitable component, device, element, or object where appropriate and based on particular needs. Any of the memory items discussed herein should be construed as being encompassed within the broad term "memory element." The information being tracked or sent to the controller 940 could be provided in any database, register, control list, cache, or storage structure, all of which can be referenced at any suitable timeframe. Any such storage options may be included within the broad term "memory element" as used herein. Similarly, any of the potential processing elements, modules, and machines described herein should be construed as being encompassed within the broad term "processor," e.g. processor 942. The controller 940 may also include suitable interfaces for receiving, transmitting, and/or otherwise communicating data or information in a DAC environment.

Note that in certain example implementations, mechanisms for envelope-dependent noise-shaped segmentation as outlined herein may be implemented by logic encoded in one or more tangible media, which may be inclusive of non-transitory media, e.g., embedded logic provided in an application specific integrated circuit (ASIC), in digital signal processor (DSP) instructions, software (potentially inclusive of object code and source code) to be executed by a processor, or other similar machine, etc. In some of these instances, memory elements, such as e.g. the memory 944 shown in FIG. 9, can store data or information used for the operations described herein. This includes the memory elements being able to store software, logic, code, or processor instructions that are executed to carry out the activities described herein. A processor can execute any type of instructions associated with the data or information to achieve the operations detailed herein. In one example, the processors, such as e.g. the processor 942 shown in FIG. 9, could transform an element or an article (e.g., data) from one state or thing to another state or thing. In another example, the activities outlined herein may be implemented with fixed logic or programmable logic (e.g., software/computer instructions executed by a processor) and the elements identified herein could be some type of a programmable processor, programmable digital logic (e.g., a field programmable gate array (FPGA), a digital signal processor (DSP), an EPROM, EEPROM) or an ASIC that includes digital logic, software, code, electronic instructions, or any suitable combination thereof.

Figure 11:
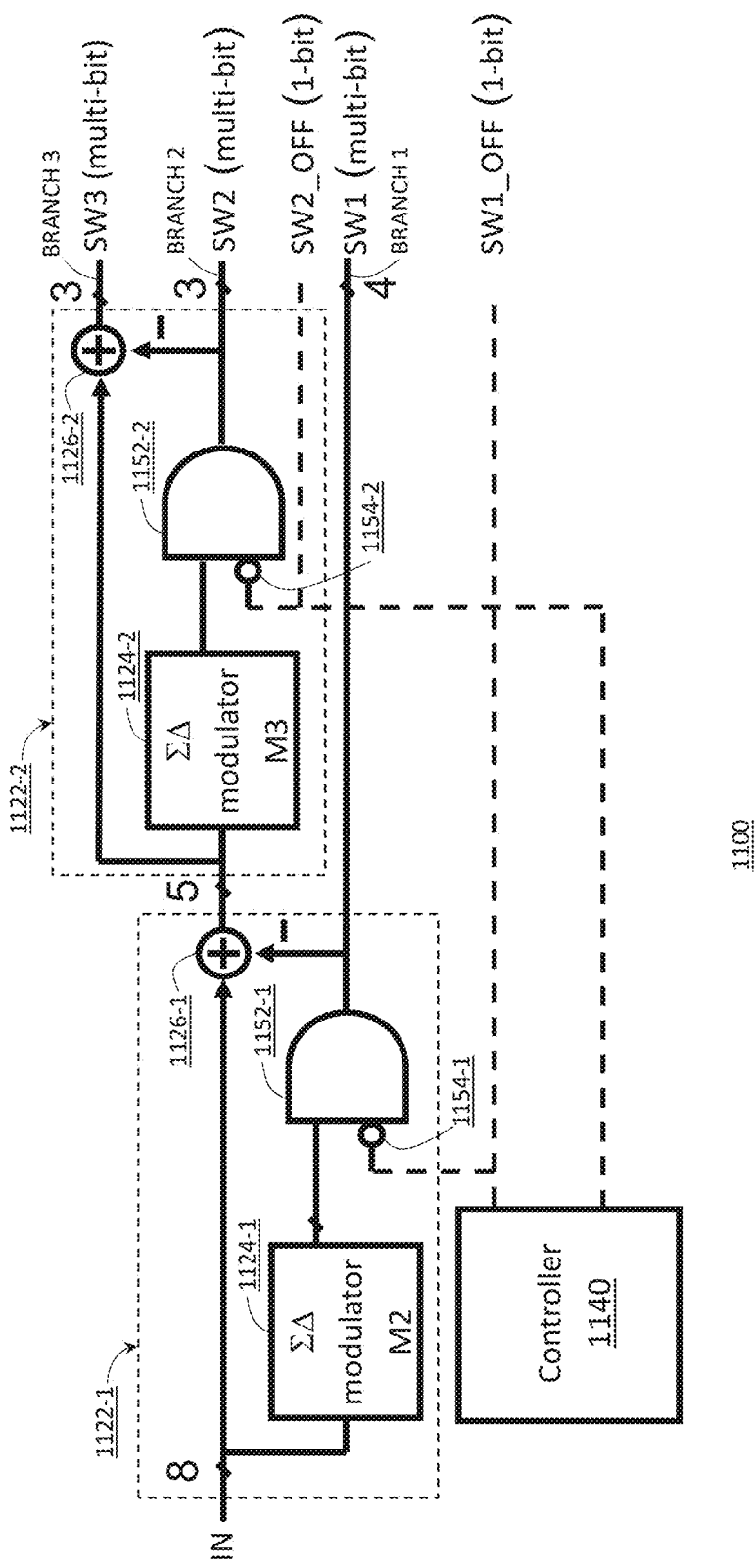
FIG. 11 illustrates a schematic diagram of an exemplary implementation of an envelope-dependent noise-shaped splitter, according to some embodiments of the disclosure.

In various embodiments, each sub-word DAC group 918 may be associated with a respective individual controller 940. In other embodiments, the controller 940 may be configured to control two or more, possibly all, sub-word DAC groups of a DAC. Furthermore, while FIG. 9 illustrates the controller 940 to be included within the DAC system/DAC 900, in other embodiments, the controller 940 may be implemented external to the DAC/DAC system 900, in which case the controller 940 may be configured to control the DAC/DAC system 900 remotely, via any appropriate communication channel. In other words, instead of being implemented within the DAC 900 as shown in FIG. 9, the controller 940 may be external to the DAC 900 and be communicatively coupled to the DAC 900. In still other embodiments, the controller 940 may be implemented in a single envelope-dependent noise-shaped segmentation circuit 950, an example of which is illustrated in FIG. 11.

Figure 10:
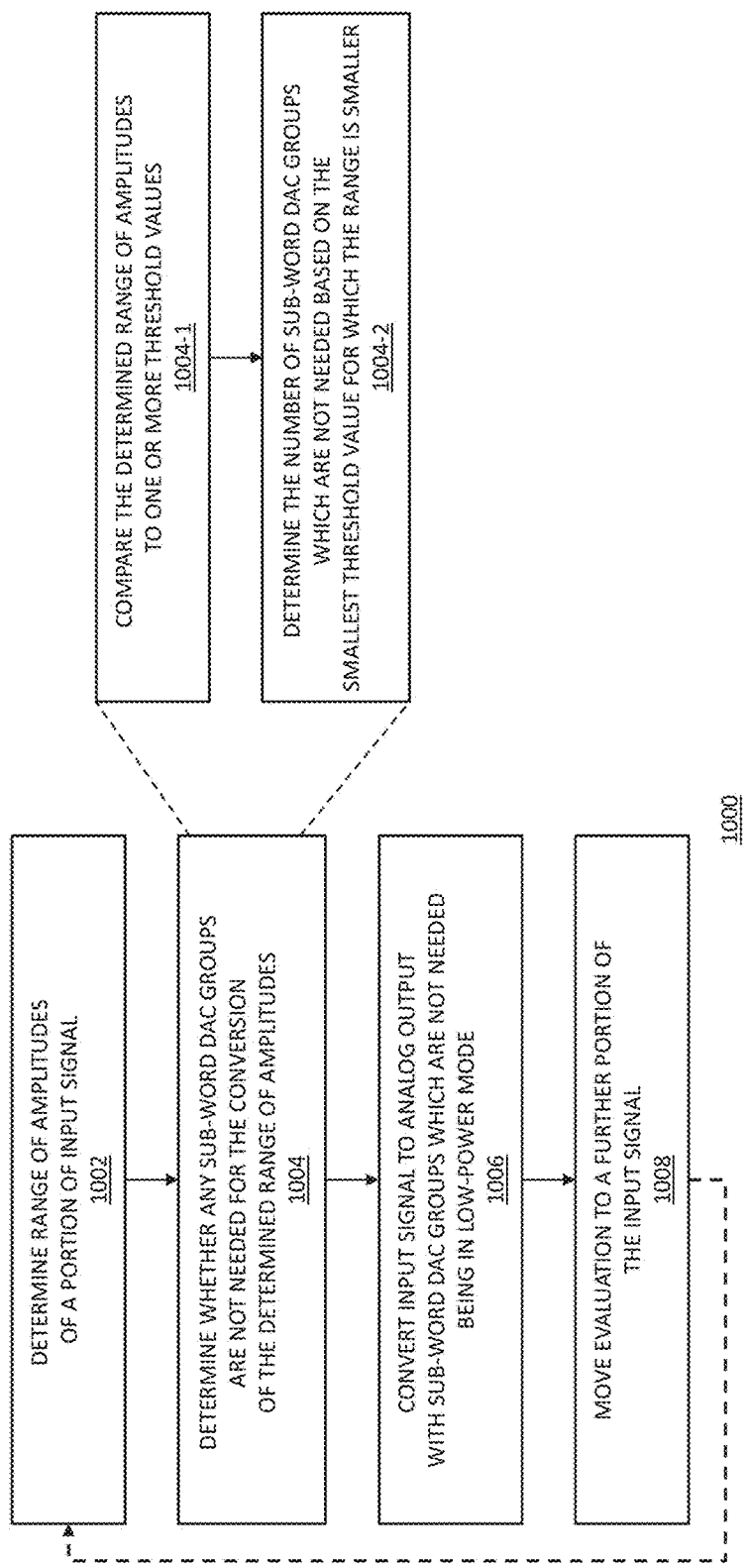
FIG. 10 illustrates a flow chart of an envelope-dependent noise-shaped segmentation method, according to some embodiments of the disclosure.

FIG. 10 illustrates a flow chart of an envelope-dependent noise-shaped segmentation method 1000, according to some embodiments of the disclosure. Although method 1000 is now described with reference to elements illustrated in FIG. 9, any system or apparatus configured to perform steps of this method, in any order, is within the scope of the present disclosure.

As shown in FIG. 10 with box 1002, the method 1000 may begin with the controller 940 determining a range of amplitudes of a portion of an input signal currently provided, or to be provided in the future, to the DAC 900. In some embodiments, the range of amplitudes may be determined by the controller 940 tracking the amplitude of the input signal, e.g. using a look-ahead functionality provided in another digital engine, e.g. in an interpolator. In other embodiments, the range of amplitudes may be determined using an additional digital peak detector, as known in the art. For example, such a digital peak detector (not shown in FIGUREs) could be configured to monitor the original digital input at the baseband sample rate, or in some case monitor the sigma-delta modulated digital output of the first modulator M1 902 and provide its output to the controller 940, using any kind of appropriate communicative connection to the controller 940. A person of ordinary skill in the art would readily recognize various other methods for determining a range of amplitudes of a signal, all of which are within the scope of the present disclosure.

In some embodiments, the controller 940 may be determining a range of amplitudes of the input signal before the resolution of the signal is reduced by the modulator M1 902. In other embodiments, the controller 940 may be determining a range of amplitudes of the input signal of the reduced resolution, as provided from the modulator M1 902.

As shown in FIG. 10 with box 1004, the controller 940 may then be configured to determine whether any of the sub-word DAC cells may be put into a low-power mode because they are not needed for the conversion of the tracked portion of the input signal. Determination of box 1004 is made based on the range of amplitudes determined in box 1002 by evaluating the number of DAC cells that may be necessary for generating the analog output corresponding to the evaluated portion of the input signal. In some optional embodiments illustrated in FIG. 10 with boxes 1004-1 and 1004-2, the determination may be made by comparing the determined range of amplitudes with one or more threshold values (box 1004-1) and then determining whether some of the sub-word DAC groups are not needed for the conversion of the digital input signal and the application of the DEM techniques based on the smallest threshold for which it was determined that the range of input amplitudes of box 1002 is smaller (box 1004-2).

For an example of how the controller 940 may determine whether some sub-word DAC groups are not needed in box 1004, consider an example of an 8-bit wide input words Win provided from the noise shaper M1 902 to the noise-shaped splitter 903 configured to split the input words into three sub-words SW1, SW2, and SW3 as illustrated in FIG. 9. As described above, in such an implementation, the 4-bit wide sub-word SW1 would contain the most significant bits, while the 3-bit wide sub-word SW3 would contain the least significant bits. In such an example, three sub-word DAC groups 918 with respective resolution of 4-, 3-, and 3-bits could be used to convert a certain maximum range of amplitudes of input digital signals, referred to as a "full scale" (FS) of a DAC. In some embodiments, the controller 940 may be configured to compare the range of amplitudes of the portion of the input signal determined in box 1002 to e.g. a first threshold TH1 of $FS/2^4$. The determined range being less than $½^4$ of the full scale of the DAC means that the digital input words Win are 4 bits (8−4=4) or less (i.e. the amplitude of the input signal is that much lower than the maximum amplitude of 8-bits so that each input word Win can be represented in 4 or less bits). In this case, the controller 940 may be configured to determine that the first sub-word DAC group 918-1 configured to convert the 4 MSB's split off from the input word Win is not really necessary because those bits would be zero for such low-amplitude input signals. Upon such determination, the controller 940 would put the first sub-word DAC group 918-1 into a low-power state.

As used herein, the term "low-power" state or mode of a sub-word DAC group refers to the DAC cells of that sub-word DAC group being put into any kind of power saving mode, compared to a nominal full-power mode of operation, which would reduce power consumption of a DAC. For example, in case of three-level DACs, DAC cells of the sub-word DAC group(s) identified as not needed for the conversion of the input word Win may be completely turned off to save power. In case of two-level DACs, for each sub-word DAC group identified as not needed for the conversion of the input word Win, half of the DAC cells may be put and kept in +1 state and the other half of the DAC cells may be put and kept in a −1 state, thus resulting in power savings due to the reduced amount of switching between +1 and −1 states. Since the input frequency is typically slow, the DAC cells of the unused sub-word DAC group(s) will typically stay in a low-power mode (e.g. be turned off and stay off, in case of 3-level DACs) for long periods of time, depending on the signal envelope, resulting in power savings during that time. In some embodiments, the encoders 915 in branches containing sub-word DAC groups which were determined to be put into a low-power state could also be placed into the low-power state since their outcome is not needed for the conversion because their corresponding sub-word DAC groups are not doing the conversion.

In some embodiments, the controller 940 may be configured to compare the range of amplitudes of the portion of the input signal determined in box 1002 to multiple threshold values. Such embodiments could be particularly useful for implementations when an input digital word Win is split up into more than two sub-words because it would enable placing sub-word DAC groups of more than one branch into a low-power state. In general, when an input word Win is split up into N sub-words according to noise-shaped segmentation approach described herein, where N is an integer greater than 1, at most (N−1) sub-word branches may be put into a low-power state, so that there will be at least one branch (the LSB branch) where conversion of the input signal takes place. Continuing with the example described above, the controller 940 may compare the range also to e.g. a second threshold TH2 of $FS/2^6$. The determined range being less than $\frac{1}{2}^6$ of the full scale of the DAC means that the digital input words Win are 2 bits (8−6=2) or less (i.e. the amplitude of the input signal is that much lower than the maximum amplitude of 8-bits so that each input word Win can be represented in 2 or less bits). In this case, the controller 940 may be configured to determine that both the first sub-word DAC group 918-1 and the second sub-word DAC group 918-2 are not necessary for converting the input digital signal because the bits of the input words converted by those groups would be zero anyway (since the input words only have 2 bits or less). Upon such determination, the controller 940 would put both the first sub-word DAC group 918-1 and the second sub-word DAC group 918-2 into a low-power state.

Comparing the range of amplitudes with multiple threshold values has the advantage of providing a finer level of granularity in adjusting the number of sub-word DAC groups to be used for conversion of the digital input signal. In turn, placing some sub-word DAC groups into a low-power state, also means that whatever DEM techniques may be applied by the encoders 915 would be applied to a lesser number of DAC cells, advantageously enabling implementation of adaptive DEM techniques (i.e. DEM techniques where the number of DAC cells on which a particular DEM technique is applied depends on the amplitude of the digital signal to be converted).

In the embodiments where the controller 940 uses a digital peak detector to determine amplitudes, the controller 940 could be configured to compare the digital peak detector data against one or more threshold values to decide which sub-word DAC groups to use for the conversion operation.

If, in box 1004, the controller 940 determines that the amplitude of the digital input signal is such that all sub-word DAC groups are needed for conversion, then conversion proceeds according to conventional noise-shaped segmentation, with all branches used for conversion.

The controller 940 may be configured to optimize comparison of the determined range of input digital values in any suitable manner which would be apparent to a person of ordinary skill in the art based on the descriptions provided herein. For example, in some embodiments, the controller 940 may arrange the thresholds in the order from the smallest to the largest and then compare the determined range to the thresholds arranged in their order starting from the smallest threshold. In such embodiments, the controller 940 may be configured to only continue to the next threshold if it is determined that the determined range is not smaller than the current threshold.

For example, consider that the determined range is between $\frac{1}{2}^6$ and $\frac{1}{2}^4$ of the full scale of an 8-bit, 3 branch DAC such as the one shown in FIG. 9 and there are two threshold levels: $\frac{1}{2}^4$ and $\frac{1}{2}^6$ of the FS. The controller 940 would then first compare the determined range to $\frac{1}{2}^6$ of the full scale (i.e., the smallest threshold), determine that the range is not smaller than that threshold, and then continue to the next threshold. The next threshold is $\frac{1}{2}^4$. The controller 940 would determine that the range is smaller than that threshold and, therefore, would establish that the input words Win have 4 bits or less and that the upper two branches would be sufficient for converting such input words, i.e. that the MSB sub-word DAC group 918-1 does not need to be used for conversion. The controller 940 would then limit the number of sub-word DAC groups used for the conversion of the input signal and the application of DEM techniques to the second sub-word DAC group 918-2 and the third sub-word DAC group 918-3.

In other embodiments, the controller 940 may compare the determined range to thresholds starting from the largest threshold and gradually place the sub-word DAC groups, starting with the MSB sub-word DAC group, as the range is determined to be less than each subsequent, smaller, threshold. In other embodiments, the controller 940 may compare the determined range to multiple thresholds simultaneously (e.g. using parallel processing) or substantially simultaneously, or sequentially in any order of thresholds.

Returning back to FIG. 10, the method may then proceed to box 1006, where the controller 940 ensures that the input signal Win is converted to analog output with sub-word DAC groups which were determined to not be needed for conversion being in a low-power state. This intrinsically limits application of whatever DEM technique may be used to compensate or reduce the mismatch between different DAC cells of the DAC 900 to the number of DAC cells of the sub-word DAC groups which remain active (i.e. which are not placed into a low-power state). In other words, in box 1006, the controller 940 ensures that the conversion of the input signal Win is limited only to those sub-word DAC groups which were determined to be needed for the conversion, i.e. which were selected for the conversion. If at least one sub-word DAC groups was determined to not be needed for the conversion, then the noise-shaped digital input is routed from that, now unused, sub-word DAC group to the sub-word DAC group of one of the branches which were selected. In some embodiments, even if sub-word DAC groups of some branches may be not used/selected for conversion, preferably the digital components of those branches, such as e.g. sigma-delta modulators M2 and M3 shown in FIG. 6, are kept fully operational (i.e. they operate as if the sub-word DAC group of each of those branches was used for conversion, not put into a low-power mode). Doing so would allow M2 and/or M3 to update their respective digital state variables regardless of whether they are used in the conversion to analog. Hence, when the input signal exceeds the respective thresholds, M2 and M3 will be inserted back to the signal flow to participate in the conversion process without causing any glitches or discontinuities in the output.

In some embodiments, the evaluation of a portion of the input signal and adjusting the number of sub-word DAC groups as illustrated with boxes 1002-1006 is performed multiple times, e.g. continuously or at certain points in time, evaluating different portions of the input signal. For example, a portion of the input signal being evaluated may be viewed as a sliding window, sliding forward in time as the input signal is being converted. In such embodiments, the method of FIG. 10 may then proceed to box 1008 where evaluation is moved to a further portion of the input signal, after which actions of boxes 1002-1006 are repeated for the further portion. This is indicated in FIG. 10 with a dashed arrow from the box 1008 to the box 1002.

In other embodiments, the entire input signal may be evaluated at once, which may be particularly advantageous e.g. when the controller 940 is provided with the maximum amplitude of the input signal for all amplitudes of the input signal, where steps 1002-1006 are performed just once, for the entire signal.

In the embodiments where the input signal is evaluated portion by portion, it may happen that, once some sub-word DAC groups have been put into a low-power state, the amplitude range of a subsequent portion of the input signal is such that the DAC cells of one or more of such sub-word DAC groups need to be used for the conversion. In this case, the controller 940 may be configured to switch back to using those sub-word DAC groups for the conversion and the application of the DEM techniques. In some embodiments, the controller 940 could implement hysteresis in controlling which sub-word DAC groups are used for the conversion, i.e. the phenomenon in which the value of a physical property lags behind changes in the effect causing it. For example, the controller 940 could be configured to turn off, or otherwise unselect for conversion, certain one or more sub-word DAC groups when the amplitude of the input signal drops below a certain first threshold, but only turn those sub-word DAC groups back on, or otherwise select for conversion again, when the amplitude of the input signal rises above a certain second threshold which is higher than the first threshold. By implementing hysteresis, the controller 940 can ensure that the switch between various sub-word DAC groups used for the conversion reacts less rapidly than it otherwise would, by taking recent history into account.

FIG. 11 illustrates a schematic diagram of an exemplary implementation of an envelope-dependent noise-shaped splitter 1100, according to some embodiments of the disclosure. The noise-shaped splitter 1100 may be implemented as the splitter 950 in a system such as the one shown in FIG. 9. FIG. 11 illustrates a tree structure with two levels of segmentation, which results in three branches similar to those shown in FIG. 6. Functionality of elements having similar reference numerals in FIGS. 6 and 11 is similar and, therefore, in the interests of brevity, descriptions of this functionality is not repeated here for the elements shown in FIG. 11. In particular, modulators 1124-1 and 1124-2 are similar to the modulators 624-1 and 624-2, and subtractors 1126-1 and 1126-2 are similar to the subtractors 626-1 and 626-6. Segmentation circuits 1122-1 and 1122-2 are also similar to the segmentation circuits 622-1 and 622-2 of FIG. 6, except that each of the segmentation circuits 1122 further includes an AND gate 1152 configured to receive a control signal from a controller 1140 indicating whether or not to put the sub-word DAC group of one of their respective MSB branches into a low-power state. The controller 1140 may be configured to operate as the controller 940 described with reference to FIG. 9 and to generate a first control signal SW1_OFF (shown in FIG. 11 with dashed lines), indicating, for the example of FS 8-bit wide input words Win being split into three sub-words SW1, SW2, and SW3 of 4-, 3-, and 3-bits wide, whether to put the sub-word DAC group converting the first sub-word SW1 into a low-power state (e.g. turn the DAC group off, in case 3-level DAC cells are used). Similarly, the controller 1140 is configured to generate a second control signal SW2_OFF (also shown in FIG. 11 with dashed lines), indicating whether to put the sub-word DAC group converting the second sub-word SW2 into a low-power state (again, e.g. turn the DAC group off, in case 3-level DAC cells are used). Control signals SW1_OFF and SW2_OFF may be a 1-bit signals and may be generated by the controller 1140 to not select DAC groups of branch 1 and branch 2, respectively, for conversion of the input values. The architecture shown in FIG. 11 illustrates that when SW1_OFF is low (i.e. corresponding to a bit of 0), it is inverted by an inverter 1154-1 to become high (i.e. corresponding to a bit of 1), and with two high inputs to the AND gate 1152-1 the 4-bit first sub-word SW1 passes through the gate and is subtracted by the subtractor 1126-1. Thus, when SW1_OFF is low, the sub-word DAC group of the first branch is selected to convert the sub-word SW1. However, when the control signal SW1_OFF is high (i.e. corresponding to a bit of 1), it is inverted by the inverter 1154-1 to become low (i.e. corresponding to a bit of 0), and with one low input to the AND gate 1152-1 the 4-bit first sub-word SW1 does not pass through the gate and is not subtracted by the subtractor 1126-1. Thus, when SW1_OFF is high, the sub-word DAC group of the first branch is not selected to convert the sub-word SW1. This means that the amplitude of the input signal Win is sufficiently low that the input signal only needs 5 bits as most, and the sub-DAC group of branch 1 may be turned off (or put into any other low-power state) by ensuring that the control signal SW1_OFF is high. The AND gate 1152-2 in combination with an inverter 1154-2 operates in a similar manner to enable that the sub-DAC group of branch 2 may be turned off or put into any other low-power state.

Envelope-dependent noise-shaped segmentation controllers described herein may operate continuously in order to continuously adjust the number of sub-word DAC groups used for conversion. If one or more sub-word DAC groups are put into a low-power state for a period of conversion a certain part of the input signal, when the input amplitude increases beyond the threshold(s), these sub-word DAC groups may be brought back to a full-power state where they can be used for conversion again, according to the original noise-shaped splitting approach.

When a multi-bit sigma-delta noise shaper output is split into multiple sub-words, only one of them will have the input signal content, the rest will have only shaped quantization noise. Adaptive length DEM techniques cannot be applied to sub-words which contain only shaped noise because a digital peak detector would not be able to track said noise and therefore lowest power consumption could not be achieved by merely applying such techniques to conventional noise-shape splitters. However, turning one or more sub-word DAC groups off (or placing them in any other possible low-power state) according to the signal envelope allows significantly reducing power consumption, especially in case 3-level DAC are used and are turned off when in low-power state.

When an architecture such as the one shown in FIG. 11 is implemented, at the transient when SW1_OFF or SW2_OFF are asserted, the instantaneous DAC gain may be slightly different due to the DAC gain mismatch between sub-word DAC groups for converting sub-words SW1, SW2, and SW3, but there is expected to be no distortion due to the application of the envelope-dependent noise-shaped segmentation techniques described herein once the transients are gone. Furthermore, since according to the techniques proposed herein outputs of some sigma-delta modulators (e.g. modulators 1124-1 and 1124-2) will not be used when the input signal Win has small signal levels, the idle tones of these modulators will not appear in the analog output, resulting in better DAC idle tone performance. Furthermore, when certain sub-word DAC groups are shut off, their element mismatch errors are not in the analog output either, which is expected to lead to a better theoretical DAC SNR.

Simulation Results

FIGS. 12-15 illustrate simulation results for scenarios applying envelope-dependent noise-shaped segmentation methods, according to some embodiments of the disclosure. Because these FIGURES refer to Fast Fourier Transforms, first, a brief description of these transforms is provided.

Behavior of signals can be analyzed in the time domain (e.g., how the signal amplitude varies over time) as well as the frequency domain (i.e., the different frequency components that make up the signal), where the Fourier transform mathematically relates these two domains. In addition, a signal can be analyzed as a continuous waveform or, in digital-signal processing (DSP) applications, as a large set of time-domain points. Fast Fourier Transforms (FFTs) refer to algorithms for calculating discrete Fourier transforms (DFTs), as well as their inverses (IDFTs), of signals represented in digital form. Because of the ubiquitous use of Fourier transforms across signal-processing applications, many different FFT algorithms exist, such as e.g. decimation in time, decimation in frequency, radix-r, radix-4, mixed radix, etc. As a result of applying a FFT to a signal, a frequency decomposition of a portion of the signal is obtained. The frequency decomposition may be arranged in an array where frequencies are indexed, e.g. frequencies may be described as indexed by "f". Each element of such an array, indexed by (f) comprises a value resulting from the application of the transformation function. The values may be complex values or a positive real quantities X(f) of the complex values, such quantities representing magnitudes of e.g. signal acquired by a receiver, presented e.g. as an actual magnitude, a squared magnitude, or as a compressive transformation of a magnitude, such as a square root. Each element of such an array is commonly referred to as a "frequency bin" or simply a "bin," the term "bin" representing the fact that such an array may be considered as comprising a plurality of "containers" into which the signal's energy is distributed. Frequency bins often come into play in context of FFT algorithms employed by e.g. radar and sonar receivers in that separation of a particular radar or sonar signal of interest (i.e. a radar or sonar signal generated by a particular source of interest) from the total signal acquired by a radar or a sonar sensor may be achieved by identifying which bin(s) correspond to the signal of interest, i.e. at which frequencies the signal of interest is active.

Simulation results of FIGS. 12-15 are provided for the example of 8-bit input words Win as described above and two levels of segmentation as shown in FIG. 11, and 3-level DACs. The main modulator M1 (i.e. a modulator such as the modulator 902 employed with the architecture of FIG. 11) is a $2^{nd}$ order, 8-bit, 128xOSR modulator. The noise-shaped splitter modulators M2 and M3 (i.e. modulators 1124-1 and 1124-2, respectively, shown in FIG. 11) are $1^{st}$ order modulators. Input frequency is 1 kilohertz (kHz), FS input amplitude is to −60 db, clock frequency is 6.144 MHz, and element mismatch is 0.2% root-mean-square (RMS) for a Gaussian distribution of mismatch profile.

Figure 12:
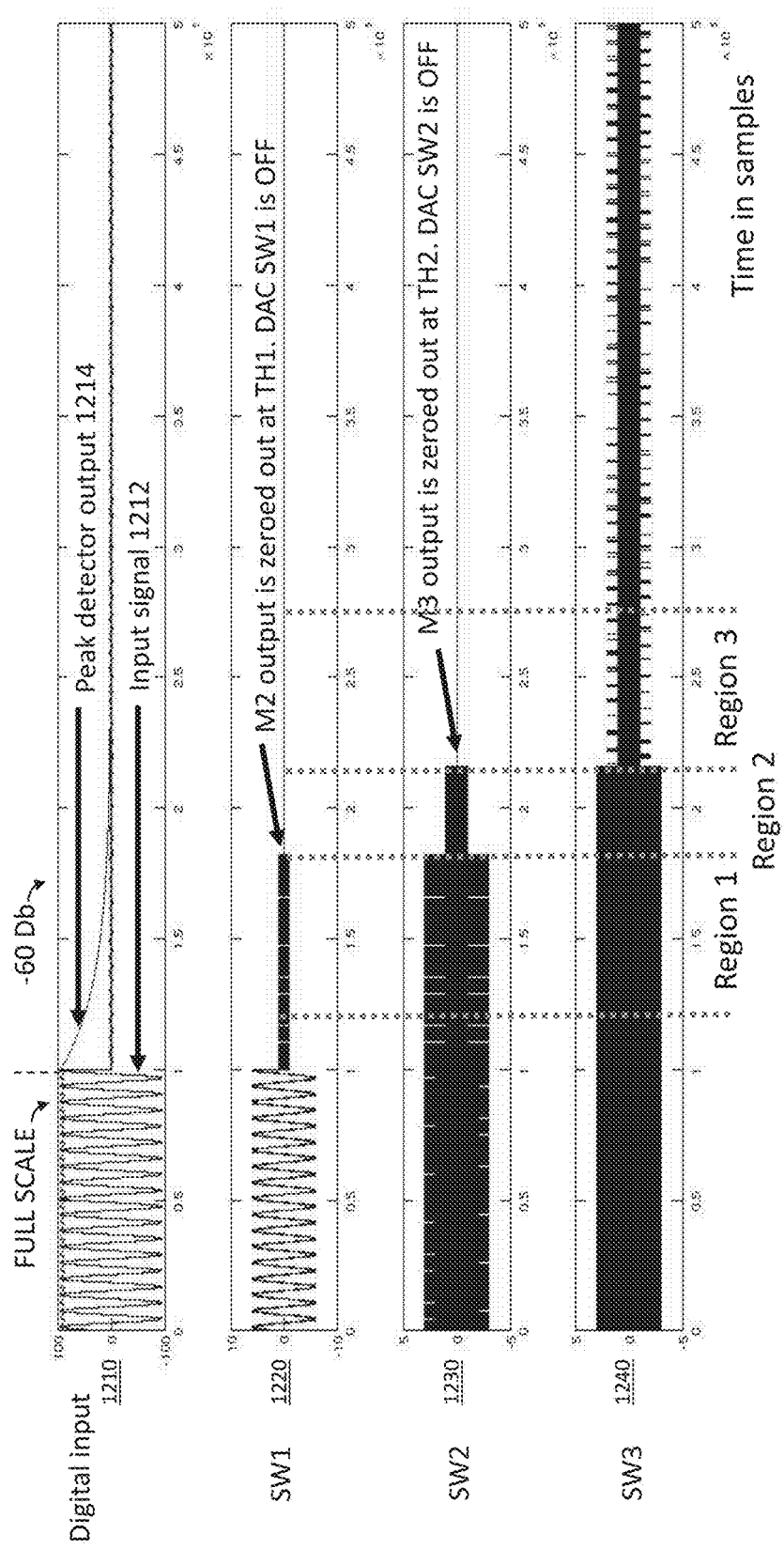
FIGS. 12-15 illustrate simulation results for scenarios applying envelope-dependent noise-shaped segmentation methods, according to some embodiments of the disclosure.

Turning now to FIGS. 12-15, box 1210 of FIG. 12 illustrates an input to the splitter 950 (8-bit), box 1220 of FIG. 12 illustrates an output of the third sub-word DAC group 918-3 (4-bit), box 1230 of FIG. 12 illustrates an output of the second sub-word DAC group 918-2 (3-bit), and box 1240 of FIG. 12 illustrates an output of the first sub-word DAC group 918-1 (3-bit). The box 1210 illustrates an input signal 1212 and a peak detector output 1214.

In view of the peak detector output 1214, three regions may be defined for the boxes 1220-1240, referred to in the following as "Region 1," "Region 2," and "Region 3." In Region 1, the peak detector output 1214 is decreasing because the amplitude of the input signal has decreased, but all sub-word DAC groups are still on because the peak detector output has not fallen below a first threshold (a situation further illustrated in FIG. 13). In Region 2, the input signal has fallen below the first threshold and the sub-word DAC group 918-1 (SW1) is turned off, while sub-word DAC groups 918-2 (SW2) and 918-3 (SW3) are on (a situation further illustrated in FIG. 14). In Region 3, the input signal has fallen below the second threshold (which is lower than the first threshold) and both the sub-word DAC group 918-1 (SW1) and the sub-word DAC group 918-2 (SW2) are turned off, while sub-word DAC group 918-3 (SW3) is on (a situation further illustrated in FIG. 15). Boundaries between Regions 1, 2, and 3 are shown in FIG. 12 with vertical dotted lines.

Figure 13:
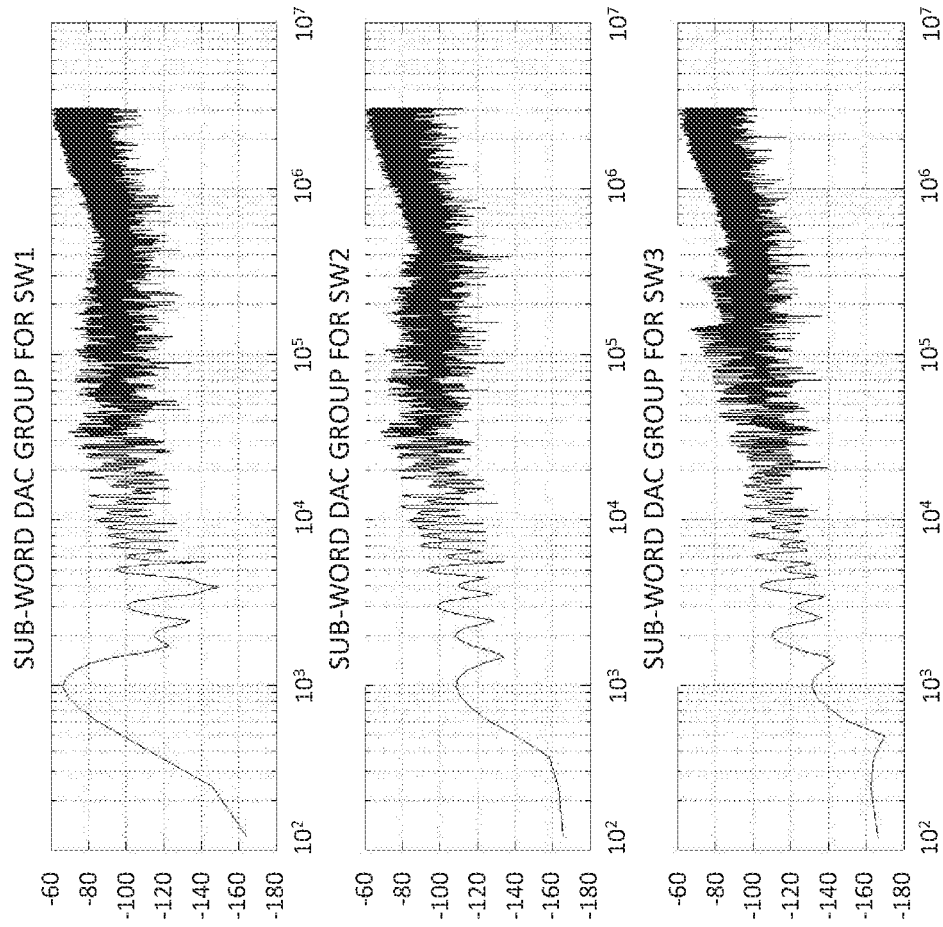
Figure 14:
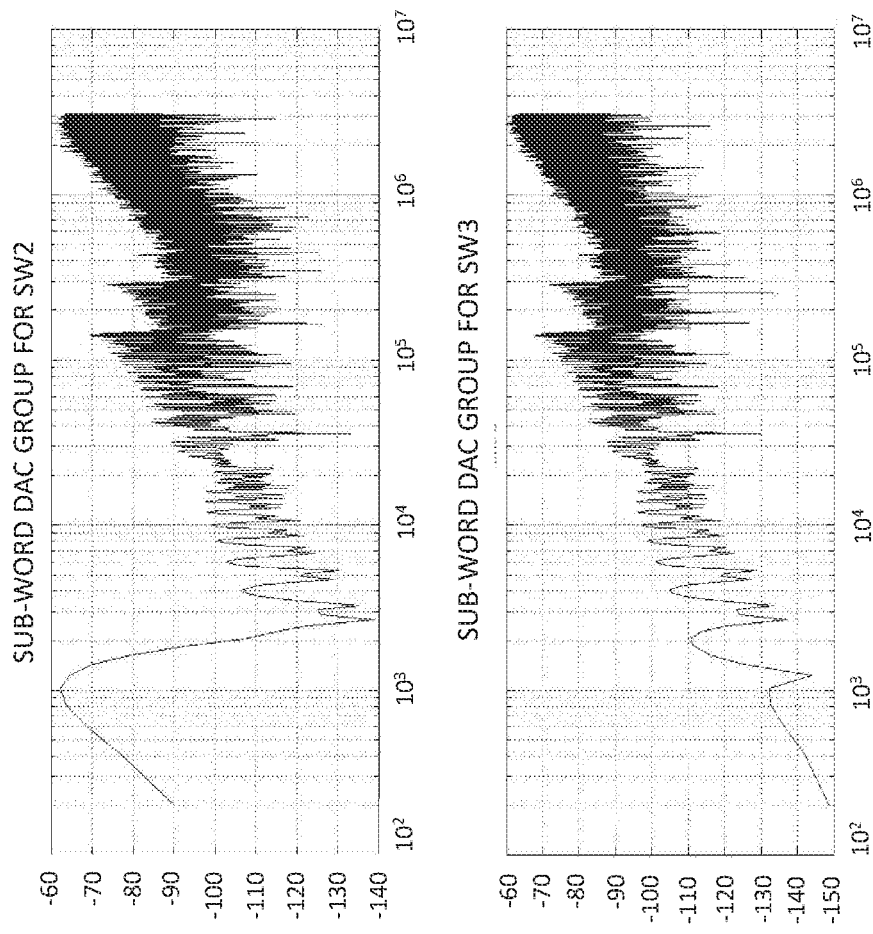
Figure 15:
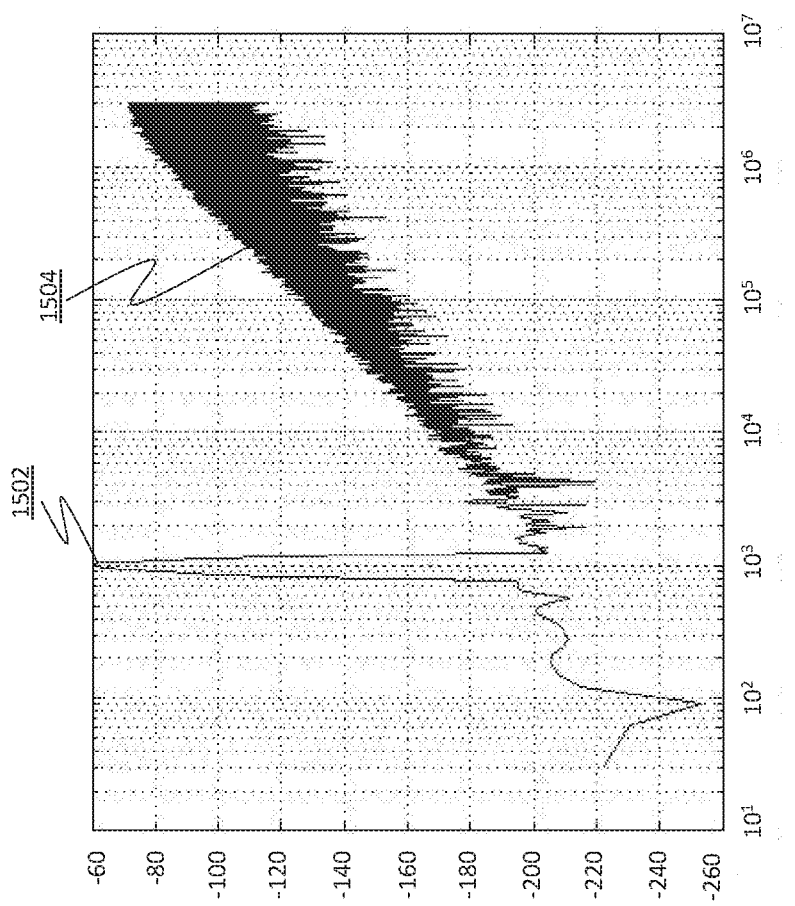

Each of FIGS. 13-15 illustrates Fast Fourier Transforms (FFTs) for the input signal provided to different sub-word DAC groups, with the x-axis of these illustrations indicating frequency, in Hz, and the y-axis indicating amplitude of the respective input signal, in dB.

FIG. 13 illustrates, from top to bottom, FFTs for the input signals to the first, second, and third sub-DAC groups 918-1, -2, and -3, respectively (Region 1). Since FIG. 13 illustrates a situation where the input signal is small, i.e. the −60 dB portion indicated in FIG. 12, but all of the sub-DAC groups are on, the top FFT of FIG. 13 (i.e. the one corresponding to SW1) has the signal of interest, while the lower two FFTs of FIG. 13 (i.e. the two FFTs corresponding to SW2 and SW3) contain shaped quantization noise.

FIG. 14 illustrates, from top to bottom, FFTs for the input signals to the second, and third sub-DAC groups 918-2, and -3, respectively (Region 2). Since FIG. 14 illustrates a situation where the input signal is small, i.e. the −60 dB portion indicated in FIG. 12, and the first sub-DAC group 918-1 group is turned off (hence it's not shown in FIG. 14), but the other two sub-DAC groups are on, the top FFT of FIG. 14 (i.e. the one corresponding to SW2) has the signal of interest, while the bottom FFT of FIG. 14 (i.e. the FFT corresponding to SW3) contains shaped quantization noise.

FIG. 15 illustrates an FFT for the input signals to the third sub-DAC groups 918-3 when the other two sub-word DAC groups are turned off (Region 3). The FFT shown in FIG. 15 has a peak 1502 corresponding to the signal of interest and very clean shaped quantization noise in the area 1504. An analog filter may be used to filter out such clean quantization noise.

Controlling DAC Cells in a Three-Level DAC Implementing Return to Hold (RTH)

As previously described herein, embodiments of the present disclosure are particularly beneficial for three-level DACs. Some three-level DACs may be configured to implement a technique referred to as a "return-to-hold" (RTH) in order to reduce inter-symbol-interference (ISI) that causes a major degradation in the total harmonic distortion (THD) and noise performance of current steering DACs.

Figure 16:
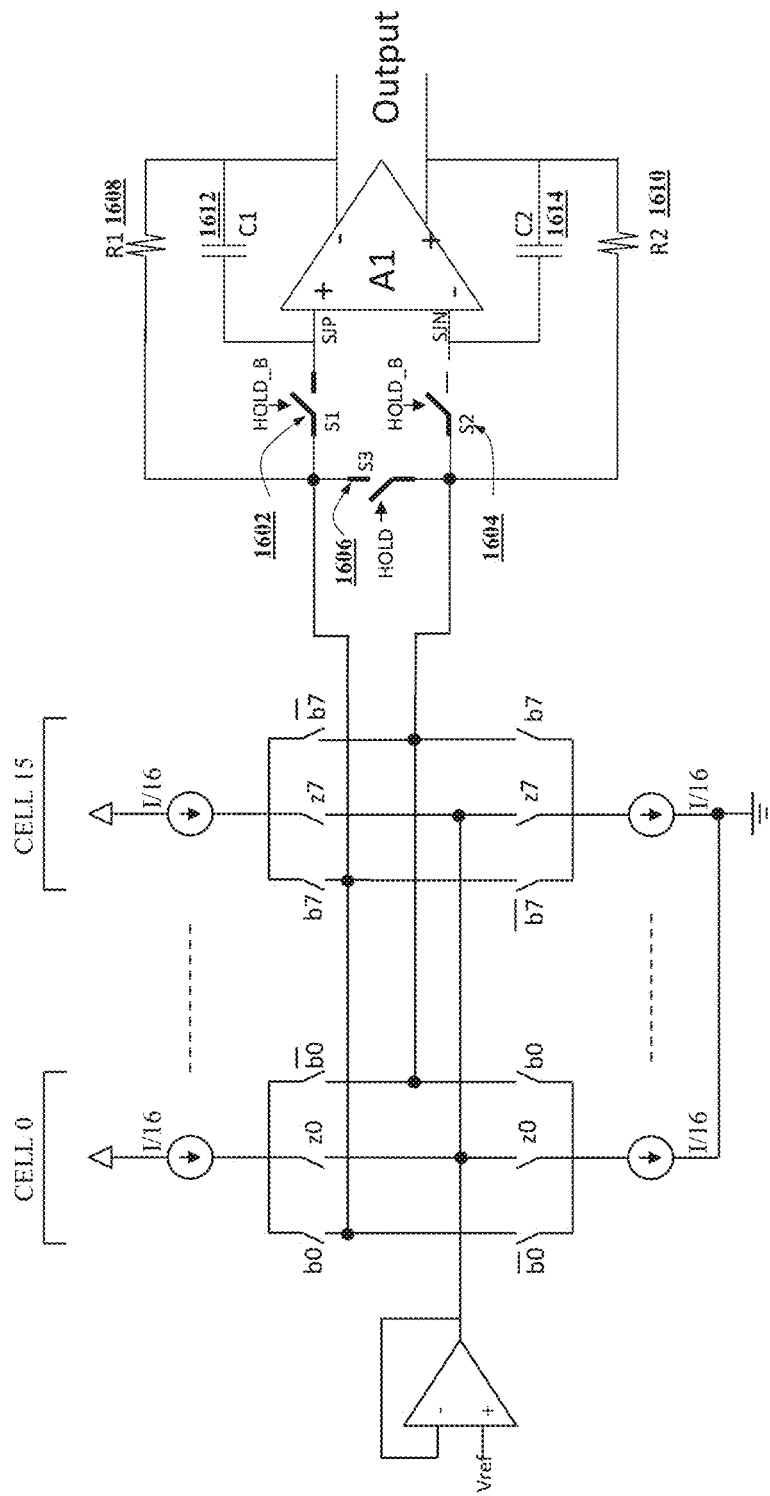
FIG. 16 illustrates a block diagram of a return-to-hold scheme for a 16-bit, three-level, thermometer code current steering DAC.
Figure 17:
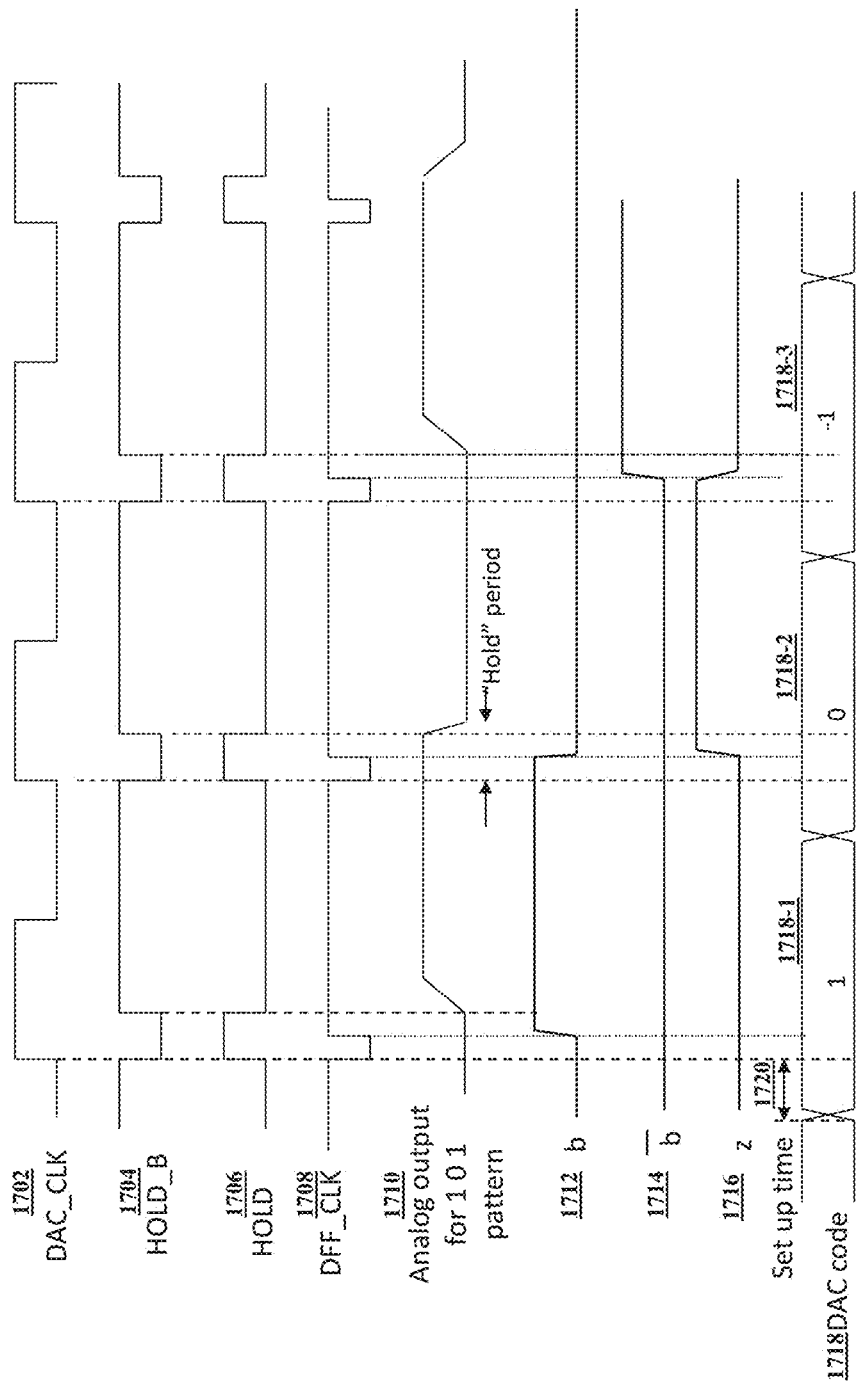
FIG. 17 illustrates a timing diagram of the return-to-hold scheme for a three-level DAC.

Details regarding the structure and operation of the RTH in context of two-level DACs are provided in U.S. Pat. No. 7,307,568 "RETURN-TO-HOLD SWITCHING SCHEME FOR DAC OUTPUT STAGE", which is hereby incorporated by reference. A return-to-hold technique as described above in context of conventional two-level DACs may be applied to three-level DACs as well, resulting in similar advantages for three-level DACs as were described for the two-level DACs in the above-referenced U.S. Patent. An example of such implementation is shown in FIG. 16, providing a block diagram of a return-to-hold scheme for a 16-bit, three-level, thermometer code current steering DAC. The return-to-hold scheme is implemented on a three-level DAC by the addition of switches S1 1602, S2 1604, and S3 1606. In FIG. 16, switches S1 1602 and S2 1604 are controlled by a HOLD_B signal while switch S3 1606 is controlled by a HOLD signal. The timing diagram of the clock, the current cell control bits and the control signals are shown in FIG. 17.

The operation of the RTH circuit shown in FIG. 16 may be described as follows. When the rising edge of the clock 1702 arrives, HOLD_B 1704 becomes LOW and disconnects the feedback resistors R1 1608 and R2 1610 from the summing junctions of the I-to-V converter by turning off switches S1 1602 and S2 1604. At the same time, HOLD 1706 becomes HIGH and connects the left hand sides of the resistors R1 1608 and R2 1610 via switch S3 1606. The outputs of the current cells are also short circuited together via switch S3 1606. During this "hold" period, the I-to-V converter is in the "hold" mode, its output voltage is kept at the same value by the capacitors C1 1612 and C2 1614. Since resistors R1 1608 and R2 1610 are connected across the positive and negative outputs of the I-to-V converter, the mid-point of this resistor string (the terminals of switch S3 1606) is set at the output common-mode (CM) voltage of the amplifier A1. Since the output current cells are connected to this point, amplifier A1 is acting as a CM buffer and holds their drains at the CM level, eliminating the need for an extra CM buffer.

For the circuit of FIG. 16, during the "hold" period, DAC flip-flop output is changed in response to change of the DAC code. The change of flip-flop output is not expressly shown in FIG. 17. What is shown in FIG. 17 is the change in DAC code 1718, i.e. changing of the digital values. This change happens a little bit before the hold periods, with an offset that may be referred to as set-up time 1720, which is a time it takes to set up the change in D-flip flop output in response to the change of the DAC code.

While, during the "hold" period, DAC flip-flop output is changed in response to change of the DAC code, analog output 1710 is unchanged since the feedback resistor R1 1608 and R2 1610 are still disconnected from the summing junctions SJP and SJN. When the "hold" period ends, S3 1606 is turned off, S1 1602 and S2 1604 are turned on. Resistors R1 1608 and R2 1610 are connected back to SJP and SJN allowing the DAC current to be converted to the output voltage. Since the DAC flip-flop output changes during the "hold" period, the output has no information or memory about the rise and fall time of each individual switching current cell and the output voltage is free of inter-symbol interference.

For each DAC cell (e.g. each of the exemplary bits 0-15 shown in FIG. 16) of a three-level return-to-hold DAC, when a digital value of 1 is converted, switch b is closed while switches b_bar and z are open. This is illustrated in FIG. 17 with a control signal 1712 for the switch b being in a HIGH state, while a control signal 1714 for the switch b_bar and a control signal 1716 for the switch z both being in a LOW state when a digital value of 1 (indicated in FIG. 17 with reference numeral 1718-1) is converted.

Similarly, when a digital value of 0 is converted, switch z is closed while switches b and b_bar are open. This is illustrated in FIG. 17 with the control signal 1716 for the switch z being in a HIGH state, while the control signal 1714 for the switch b_bar and the control signal 1712 for the switch b both being in a LOW state when a digital value of 0 (indicated in FIG. 17 with reference numeral 1718-2) is converted.

Finally, when a digital value of −1 is converted, switch b_bar is closed while switches b and z are open. This is illustrated in FIG. 17 with the control signal 1714 for the switch b_bar being in a HIGH state, while the control signal 1712 for the switch b and the control signal 1716 for the switch z both being in a LOW state when a digital value of −1 (indicated in FIG. 17 with reference numeral 1718-3) is converted.

Figure 18:
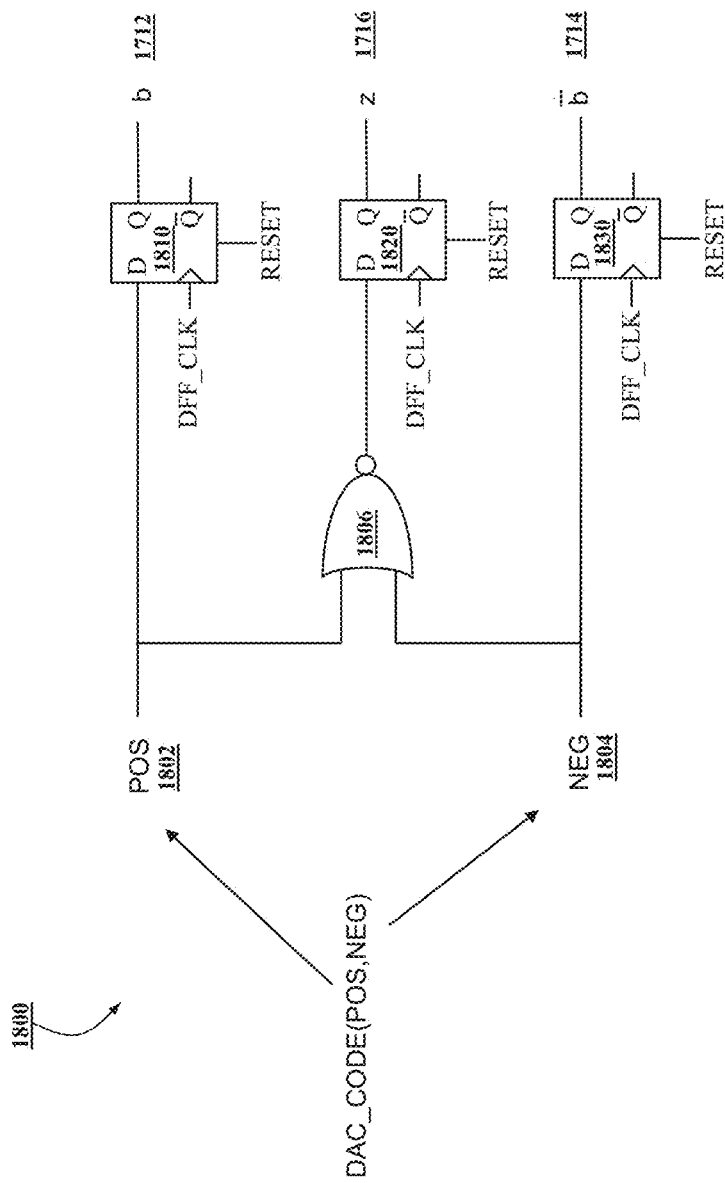
FIG. 18 illustrates a schematic diagram of control signal generation for a three-level DAC.

An exemplary circuit that could be used to generate the control signals 1712, 1714, and 1716 for, respectively, b, b_bar, and z switches of a three-level RTH DAC for each DAC cell is shown as circuit 1800 in FIG. 18. As shown in FIG. 18, control signal 1712 for the b switch is an output of a flip flop 1810, control signal 1714 for the b_bar switch is an output of a flip flop 1830, and control signal 1716 for the z switch is an output of a flip flop 1820. These control signals drive the switches to open and close as illustrated in FIG. 17.

When a digital value being converted is positive, it is provided to an input POS 1802. When a digital value being converted is negative, it is provided to an input NEG 1804 of the circuit 1800. When a digital value being converted is zero, which is the case when both input POS 1802 and NEG 1804 receive zeros, the output of NOR gate 1806 will become a logic HIGH. The positive and negative digital values and the NOR gate output are then provided to their respective flip flops 1810, 1830 and 1820, respectively.

The control signals 1712, 1714, and 1716 are only making their transitions when the HOLD signal 1706 is HIGH, at which time the I-to-V is in the "hold" stage where its voltage remains constant, ensuring that the switches are switched only during the hold periods.

FIG. 18 provides only one example for the generation of the control signals for the b, b_bar, and z switches of three-level DAC cells. In other embodiments, other circuit architectures could be used for generating these signals as known in the art, all of which are within the scope of the present disclosure.

Figure 19:
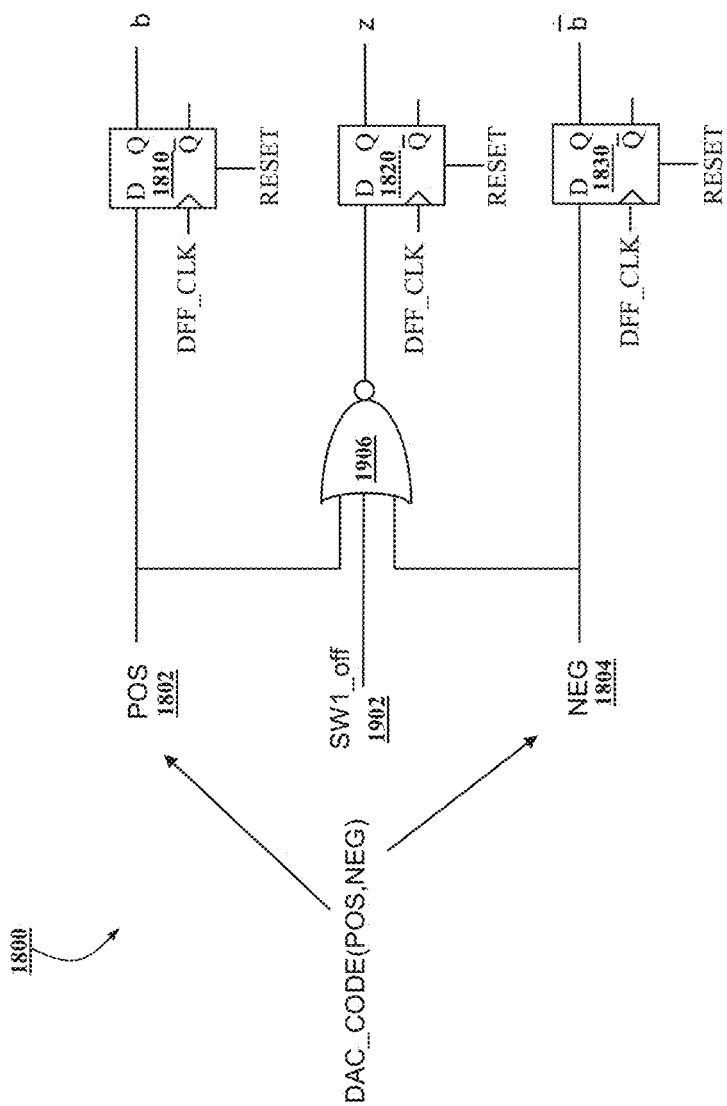
FIG. 19 illustrates a schematic diagram of control signal generation for a three-level DAC to turn off a DAC cell of a sub-word DAC group not selected for conversion, according to some embodiments of the disclosure.

FIG. 19 illustrates a schematic diagram of control signal generation for a three-level DAC to turn off a DAC cell of a sub-word DAC group not selected for conversion, according to some embodiments of the disclosure. FIG. 19 is similar to FIG. 18 and, therefore, illustrates all of the elements shown in FIG. 18, the description of which is not repeated here in the interests of brevity. In addition, FIG. 19 illustrates that a control signal SW1_OFF 1902 could be provided to a NOR gate 1906, e.g. from the controller 940/1140. The NOR gate 1906 is similar to the NOR gate 1806 except that it received an additional input in the form of the control signal SW1_off 1902. Such a control signal is described above with reference to FIG. 11.

As described with reference to FIG. 11, when SW1_OFF is HIGH (i.e. corresponding to a bit of 1), the sub-word DAC group of the first branch is not selected to convert the sub-word SW1. Since a NOR gate outputs the logic value of 1 (HIGH) if and only if all operands have a value of zero and otherwise has a value of 0 (LOW), providing a SW1_OFF signal that is HIGH to the NOR gate 1906 would result at a zero output of the NOR gate 1906, thus providing an easy manner to turn off (i.e. open or keep open) the z switch of a three-level DAC cell of the unselected sub-word DAC group. Thus, when the amplitude of the input signal is such that the DAC cells of the sub-word DAC group of BRANCH 1 are to be put in a low-power state, which would be the case when both input POS 1802 and NEG 1804 receive zeros, because of the addition of the control signal SW1_OFF 1902 with a bit value of 1, the output of NOR gate 1906 will become a logic LOW (i.e. corresponding to a bit of zero). The positive and negative digital values and the NOR gate output are then provided to their respective flip flops 1810, 1830 and 1820, respectively. Since, in this case (i.e. when SW1_OFF is high), all flip flops 1810, 1830, and 1820 would receive an input value of zero, all of the switches, i.e. the b, b_bar, and z switches, would be open, such that the current conducted by the DAC cell becomes zero.

The same signal SW1_OFF 1902 would be provided to the NOR gates of other DAC cells of the sub-word DAC group of BRANCH 1 that was originally designed to convert the first sub-word SW1.

The DAC cells of other sub-word DAC groups may also be controlled in a manner similar to that shown in FIG. 19 for the DAC group of BRANCH 1, by providing respective control signals to their NOR gates. For example, for the DAC cells of the sub-word DAC group of BRANCH 2, control signal SW2_OFF being high provided to a NOR gate similar to that shown in FIG. 19 would ensure that the z switch of each of the three-level DAC cells of the sub-word DAC group of BRANCH 2 would be open (i.e. similar to the value of the control signal for the z switch being LOW).

Exemplary Data Processing System

Figure 20:
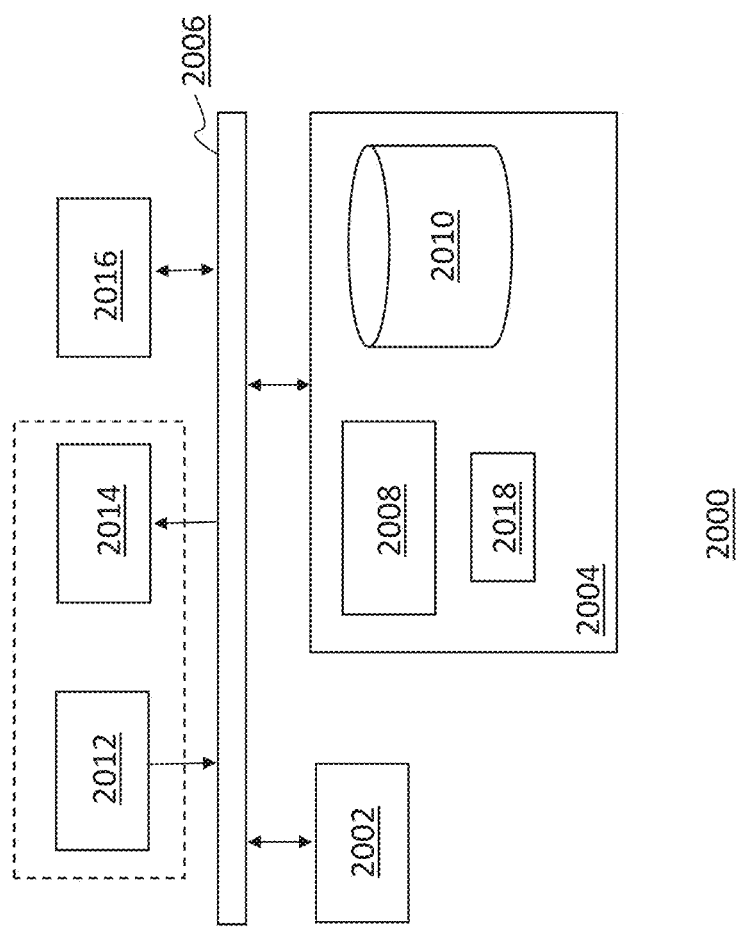
FIG. 20 depicts a block diagram illustrating an exemplary data processing system, according to some embodiments of the disclosure.

FIG. 20 depicts a block diagram illustrating an exemplary data processing system 2000, according to one embodiment of the present disclosure. Such a data processing system could be configured to e.g. function as the controller 940 described herein or as any other system configured to implement various improved mechanisms related to envelope-dependent noise-shaped segmentation techniques as described herein.

As shown in FIG. 20, the data processing system 2000 may include at least one processor 2002 coupled to memory elements 2004 through a system bus 2006. As such, the data processing system may store program code within memory elements 2004. Further, the processor 2002 may execute the program code accessed from the memory elements 2004 via a system bus 2006. In one aspect, the data processing system may be implemented as a computer that is suitable for storing and/or executing program code. It should be appreciated, however, that the data processing system 2000 may be implemented in the form of any system including a processor and a memory that is capable of performing the functions described within this specification.

The memory elements 2004 may include one or more physical memory devices such as, for example, local memory 2008 and one or more bulk storage devices 2010. The local memory may refer to random access memory or other non-persistent memory device(s) generally used during actual execution of the program code. A bulk storage device may be implemented as a hard drive or other persistent data storage device. The processing system 2000 may also include one or more cache memories (not shown) that provide temporary storage of at least some program code in order to reduce the number of times program code must be retrieved from the bulk storage device 2010 during execution.

Input/output (I/O) devices depicted as an input device 2012 and an output device 2014, optionally, can be coupled to the data processing system. Examples of input devices may include, but are not limited to, a keyboard, a pointing device such as a mouse, or the like. Examples of output devices may include, but are not limited to, a monitor or a display, speakers, or the like. Input and/or output devices may be coupled to the data processing system either directly or through intervening I/O controllers.

In an embodiment, the input and the output devices may be implemented as a combined input/output device (illustrated in FIG. 20 with a dashed line surrounding the input device 2012 and the output device 2014). An example of such a combined device is a touch sensitive display, also sometimes referred to as a "touch screen display" or simply "touch screen". In such an embodiment, input to the device may be provided by a movement of a physical object, such as e.g. a stylus or a finger of a user, on or near the touch screen display.

A network adapter 2016 may also, optionally, be coupled to the data processing system to enable it to become coupled to other systems, computer systems, remote network devices, and/or remote storage devices through intervening private or public networks. The network adapter may comprise a data receiver for receiving data that is transmitted by said systems, devices and/or networks to the data processing system 2000, and a data transmitter for transmitting data from the data processing system 2000 to said systems, devices and/or networks. Modems, cable modems, and Ethernet cards are examples of different types of network adapter that may be used with the data processing system 2000.

As pictured in FIG. 20, the memory elements 2004 may store an application 2018. In various embodiments, the application 2018 may be stored in the local memory 2008, the one or more bulk storage devices 2010, or apart from the local memory and the bulk storage devices. It should be appreciated that the data processing system 2000 may further execute an operating system (not shown in FIG. 20) that can facilitate execution of the application 2018. The application 2018, being implemented in the form of executable program code, can be executed by the data processing system 2000, e.g., by the processor 2002. Responsive to executing the application, the data processing system 2000 may be configured to perform one or more operations or method steps described herein.

Select Examples

In summary, improved mechanisms for applying noise-shaped segmentation techniques in a multi-bit DAC are disclosed. Noise-shaped segmentation refers to constructing two or more noise-shaped signals whose sum equals the original digital input signal by splitting each word of the input signal into two or more sub-words and converting each sub-word split from an input word by a respective sub-word DAC group. Disclosed mechanisms include determining a range of amplitudes of a portion of the input signal over a certain time period by tracking the amplitude of the input signal over that portion of the signal, and, when converting digital words of that portion to analog values, limiting the number of sub-word DAC groups which are used for the conversion only to a number that is necessary for generating an analog output corresponding to the portion being evaluated, which number is determined based on the tracked amplitudes and could be smaller than the total number of sub-word DAC groups. Placing unused sub-word DAC groups into a power saving mode reduces power consumption.

Example 1 provides a DAC for implementing one or more noise-shaped segmentation techniques for splitting input words of a digital input signal provided or to be provided to the DAC into a plurality sub-words. The DAC includes a plurality of sub-word DAC groups, where each sub-word DAC group is configured to convert a different sub-word, of the plurality of sub-words, split from each input word, and a controller for controlling application of the one or more noise-shaped segmentation techniques. The controller is configured to determine a range of amplitudes of at least a portion of the input signal, select one or more sub-word DAC groups of the plurality of sub-word DAC groups for conversion of the portion of the input signal, the selected one or more sub-word DAC groups corresponding to the determined range of amplitudes of the portion of the input signal, and limit the conversion of the portion of the input signal to using the selected one or more sub-word DAC groups.

Example 2 provides the DAC according to Example 1, where limiting the conversion of the portion of the input signal to using the selected one or more sub-word DAC groups includes setting one or more sub-word DAC groups of the plurality of sub-word DAC groups which were not selected for the conversion to be in a low-power mode during the conversion.

Example 3 provides the DAC according to Example 2, where each of the plurality of sub-word DAC groups includes a plurality of three-level DAC cells, and where setting the one or more sub-word DAC groups which were not selected for the conversion to be in the low-power mode includes setting the DAC cells of the one or more sub-word DAC groups which were not selected for the conversion to conduct zero current from supply to ground (e.g. turning those DAC cells off).

Example 4 provides the DAC according to Example 2, where each of the plurality of sub-word DAC groups includes a plurality of three-level DAC cells, and where setting the one or more sub-word DAC groups which were not selected for the conversion to be in the low-power mode includes ensuring that b, b_bar, and z switches of each of the plurality of three-level DAC cells are open.

Example 5 provides the DAC according to Example 2, where when the conversion of the portion of the input signal is limited to using the selected one or more sub-word DAC groups, digital components associated with each of one or more sub-word DAC groups not selected for the conversion are operating as if the one or more sub-word DAC groups not selected for the conversion were selected.

Example 6 provides the DAC according to any one of the preceding Examples, where limiting the conversion of the portion of the input signal to using the selected one or more sub-word DAC groups includes routing the input signal (which has the baseband portion therein) from one of the sub-word DAC groups not selected for the conversion to one of the sub-word DAC groups selected for the conversion.

Example 7 provides the DAC according to any one of the preceding Examples, where the controller is configured to determine the range of amplitudes by receiving data indicative of the range of amplitudes as measured by a peak detector.

Example 8 provides the DAC according to any one of the preceding Examples, where the controller is further configured to determine whether the range of amplitudes of the portion of the input signal is smaller than a threshold value, where the one or more sub-word DAC groups selected for the conversion are selected based on the threshold value when it is determined that the range of amplitudes of the portion of the input signal is smaller than the threshold value.

Example 9 provides the DAC according to Example 8, where the threshold value is one of a plurality of threshold values, determining whether the range of amplitudes of the portion of the input signal is smaller than the threshold value includes determining whether the range of amplitudes of the portion of the input signal is smaller than the threshold value for two or more of the plurality of threshold values, and the controller is configured to select the one or more sub-word DAC groups for conversion based on the smallest threshold value of the plurality of threshold values for which it was determined that the range of amplitudes of the portion of the input signal is smaller than the threshold value.

Example 10 provides the DAC according to Example 8, where the controller is further configured to, following the limitation of the conversion of the portion of the input signal to using the selected one or more sub-word DAC groups, determine a further range of amplitudes of a further portion of the input signal and removing the limitation when the further range of amplitudes is determined to be equal to or greater than the threshold value.

Example 11 provides the DAC according to Example 8, where the threshold value is equal to a fraction of the full scale of the DAC.

Example 12 provides the DAC according to any one of the preceding Examples, where the DAC is an oversampling DAC, such as e.g. a multi-bit sigma-delta DAC.

Further examples provide a method for controlling application of one or more noise-shaped segmentation techniques for splitting input words of a digital input signal provided or to be provided to a DAC into a plurality sub-words, the DAC including a plurality of sub-word DAC groups, where each sub-word DAC group is configured to convert a different sub-word of the plurality of sub-words split from each input word. The method includes steps performed by the controller according to any one of the preceding Examples.

Further examples provide a non-transitory computer readable storage medium storing instructions which, when executed by a processor, are configured to carry out a method for controlling application of one or more noise-shaped segmentation techniques for splitting input words of a digital input signal provided or to be provided to a DAC into a plurality sub-words, the DAC including a plurality of sub-word DAC groups, where each sub-word DAC group is configured to convert a different sub-word of the plurality of sub-words split from each input word. The method includes steps performed by the controller according to any one of the preceding Examples.

Further examples provide an apparatus for controlling application of one or more noise-shaped segmentation techniques for splitting input words of a digital input signal provided or to be provided to a DAC into a plurality sub-words, the DAC including a plurality of sub-word DAC groups, where each sub-word DAC group is configured to convert a different sub-word of the plurality of sub-words split from each input word. The apparatus includes means for implementing functionality according to any one of the preceding Examples.

Variations and Implementations

While embodiments of the present disclosure were described above with references to exemplary implementations as shown in FIGS. 1-20, a person skilled in the art will realize that the various teachings described above are applicable to a large variety of other implementations. For example, while some descriptions provided in the present disclosure refer to thermometer coding, these descriptions are equally applicable to other coding methods used in DACs. Further, while examples provided herein are described with reference to DACs converting an 8-bit wide digital input using noise-shaped segmentation into 3 sub-words as described above, of course in other implementations noise-shaped segmentation using any other number of sub-word DAC groups could be used. Still further, while only current steering DACs are illustrated in the FIGURES, embodiments of the present disclosure are equally applicable to other circuit architectures, e.g. to switched capacitor DACs. In switched capacitor DACs, DAC cells of the sub-word DAC groups not selected for the conversion of digital input values may be connected to reference voltages.

Embodiments of the present disclosure may be particularly advantageous for oversampling, or interpolating, DACs, such as e.g. sigma-delta DACs, because of their high speed.

Furthermore, embodiments of the present disclosure may be particularly advantageous for three-level DACs because DAC cells of the sub-word DAC groups of such DACs which are not selected for the conversion of digital values may be turned off completely, resulting in significant power savings. However, embodiments of the present disclosure are applicable to two-level DACs, implemented using either current steering or switched capacitor architecture. For two-level switched capacitor DAC architectures, implementation of some embodiments of the present disclosure may allow saving dynamic power drawn from reference voltage. For two-level current steering DAC architectures, implementation of some embodiments of the present disclosure may allow reducing dynamic mismatch error.

Still further, embodiments of the present disclosure may be used in stand-alone DACs as well as in embedded feedback DACs in analog-to-digital converter (ADC) designs.

In certain contexts, the features discussed herein can be applicable to automotive systems, safety-critical industrial applications, medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind).

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions.

In the discussions of the embodiments above, components of a system, such as e.g. clocks, multiplexers, buffers, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure related to improved noise-shaped segmentation techniques.

Parts of various systems for implementing envelope-dependent noise-shaped segmentation techniques as proposed herein can include electronic circuitry to perform the functions described herein. In some cases, one or more parts of the system can be provided by a processor specially configured for carrying out the functions described herein. For instance, the processor may include one or more application specific components, or may include programmable logic gates which are configured to carry out the functions describe herein. The circuitry can operate in analog domain, digital domain, or in a mixed signal domain. In some instances, the processor may be configured to carrying out the functions described herein by executing one or more instructions stored on a non-transitory computer readable storage medium.

In one example embodiment, any number of electrical circuits of FIGS. 9-20 may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of FIGS. 9-20 may be implemented as stand-alone modules (e.g., a device with associated components and circuitry configured to perform a specific application or function) or implemented as plug-in modules into application specific hardware of electronic devices. Note that particular embodiments of the present disclosure implementing envelope-dependent noise-shaped segmentation techniques may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the functionalities of envelope-dependent noise-shaped segmentation techniques proposed herein may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of FIGS. 9-20 may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of FIGS. 9-20 and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

It is also important to note that the functions related to envelope-dependent noise-shaped segmentation techniques as proposed herein illustrate only some of the possible functions that may be executed by, or within, system illustrated in FIGS. 9-16. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

Although the claims are presented in single dependency format in the style used before the USPTO, it should be understood that any claim can depend on and be combined with any preceding claim of the same type unless that is clearly technically infeasible.

Note that all optional features of the apparatus described above may also be implemented with respect to the method or process described herein and specifics in the examples may be used anywhere in one or more embodiments.

What is claimed is:

1. A digital-to-analog converter (DAC) for implementing one or more noise-shaped segmentation techniques, the DAC comprising:
a plurality of sub-word DAC groups, where each sub-word DAC group is configured to convert a different sub-word of a plurality of sub-words split from an input word, where at least two of the plurality of sub-words have one or more bits overlapping, and
a controller configured to:
determine a range of amplitudes of at least a portion of an input signal comprising the input word;
select one or more sub-word DAC groups of the plurality of sub-word DAC groups for conversion of the portion of the input signal, the selected one or more sub-word DAC groups corresponding to the determined range of amplitudes of the portion of the input signal; and
limit the conversion of the portion of the input signal to using the selected one or more sub-word DAC groups.

2. The DAC according to claim 1, wherein limiting the conversion of the portion of the input signal to using the selected one or more sub-word DAC groups comprises setting one or more sub-word DAC groups of the plurality of sub-word DAC groups which were not selected for the conversion to be in a low-power mode during the conversion.

3. The DAC according to claim 2, wherein each of the plurality of sub-word DAC groups comprises a plurality of three-level DAC cells, and wherein setting the one or more sub-word DAC groups which were not selected for the conversion to be in the low-power mode comprises setting the DAC cells of the one or more sub-word DAC groups which were not selected for the conversion to conduct zero current from supply to ground.

4. The DAC according to claim 2, wherein each of the plurality of sub-word DAC groups comprises a plurality of three-level DAC cells, and wherein setting the one or more sub-word DAC groups which were not selected for the conversion to be in the low-power mode comprises ensuring that b, b_bar, and z switches of each of the plurality of three-level DAC cells are open.

5. The DAC according to claim 2, wherein when the conversion of the portion of the input signal is limited to using the selected one or more sub-word DAC groups, digital components associated with each of one or more sub-word DAC groups not selected for the conversion are operating as if the one or more sub-word DAC groups not selected for the conversion were selected.

6. The DAC according to claim 1, wherein limiting the conversion of the portion of the input signal to using the selected one or more sub-word DAC groups comprises routing the input signal from one of the sub-word DAC groups not selected for the conversion to one of the sub-word DAC groups selected for the conversion.

7. The DAC according to claim 1, wherein the controller is configured to determine the range of amplitudes by receiving data indicative of the range of amplitudes as measured by a peak detector.

8. The DAC according to claim 1, wherein the controller is further configured to:
determine whether the range of amplitudes of the portion of the input signal is smaller than a threshold value,
wherein the one or more sub-word DAC groups selected for the conversion are selected based on the threshold value when it is determined that the range of amplitudes of the portion of the input signal is smaller than the threshold value.

9. The DAC according to claim 8, wherein:
the threshold value is one of a plurality of threshold values,
determining whether the range of amplitudes of the portion of the input signal is smaller than the threshold value comprises determining whether the range of amplitudes of the portion of the input signal is smaller than the threshold value for two or more of the plurality of threshold values, and
the controller is configured to select the one or more sub-word DAC groups for conversion based on the smallest threshold value of the plurality of threshold values for which it was determined that the range of amplitudes of the portion of the input signal is smaller than the threshold value.

10. The DAC according to claim 8, wherein the controller is further configured to:
following the limitation of the conversion of the portion of the input signal to using the selected one or more sub-word DAC groups, determine a further range of amplitudes of a further portion of the input signal and removing the limitation when the further range of amplitudes is determined to be equal to or greater than the threshold value.

11. The DAC according to claim 8, wherein the threshold value is equal to a fraction of the full scale of the DAC.

12. The DAC according to claim 1, wherein the DAC is a multi-bit sigma-delta DAC.

13. The DAC according to claim 1, wherein the DAC is configured to implement one or more noise-shaped segmentation techniques for splitting the input word into the plurality of sub-words.

14. The DAC according to claim 1, wherein at least one of the at least two of the plurality of sub-words that have one or more bits overlapping comprises at least two bits.

15. A method for controlling application of one or more noise-shaped segmentation techniques in a digital-to-analog converter (DAC), the method comprising:
splitting an input word into a plurality of sub-words, where at least two of the plurality of sub-words have one or more bits overlapping;
determining a range of amplitudes of at least a portion of an input signal comprising the input word;
selecting one or more sub-word DAC groups of a plurality of sub-word DAC groups of the DAC for conversion of the portion of the input signal, the selected one or more sub-word DAC groups corresponding to the determined range of amplitudes of the portion of the input signal; and
limiting the conversion of the portion of the input signal to using the selected one or more sub-word DAC groups.

16. The method according to claim 15, wherein limiting the conversion of the portion of the input signal to using the selected one or more sub-word DAC groups comprises setting one or more sub-word DAC groups of the plurality of sub-word DAC groups which were not selected for the conversion to be in a low-power mode during the conversion.

17. The method according to claim 16, wherein each of the plurality of sub-word DAC groups comprises a plurality of three-level DAC cells, and wherein setting the one or more sub-word DAC groups which were not selected for the conversion to be in the low-power mode comprises turning the DAC cells of the one or more sub-word DAC groups which were not selected for the conversion off.

18. The method according to claim 16, wherein each of the plurality of sub-word DAC groups comprises a plurality of three-level DAC cells, and wherein setting the one or more sub-word DAC groups which were not selected for the conversion to be in the low-power mode comprises ensuring that b, b_bar, and z switches of each of the plurality of three-level DAC cells are open.

19. The method according to claim 15, wherein limiting the conversion of the portion of the input signal to using the selected one or more sub-word DAC groups comprises routing the input signal from one of the sub-word DAC groups not selected for the conversion to one of the sub-word DAC groups selected for the conversion.

20. The method according to claim 15, further comprising determining whether the range of amplitudes of the portion of the input signal is smaller than a threshold value, wherein the one or more sub-word DAC groups selected for the conversion are selected based on the threshold value when it is determined that the range of amplitudes of the portion of the input signal is smaller than the threshold value.

21. The method according to claim 20, further comprising determining a further range of amplitudes of a further portion of the input signal and removing the limitation when the further range of amplitudes is determined to be equal to or greater than the threshold value.

22. The method according to claim 15, wherein the input word is split into the plurality of sub-words by applying one or more noise-shaped segmentation techniques.

23. An apparatus for controlling application of one or more noise-shaped segmentation techniques in a digital-to-analog converter (DAC), the apparatus comprising:
   means for splitting an input word into a plurality of sub-words, where at least two of the plurality of sub-words have one or more bits overlapping;
   means for determining a range of amplitudes of at least a portion of an input signal comprising the input word;
   means for selecting one or more sub-word digital-to-analog converter (DAC) groups of a plurality of sub-word DAC groups of a DAC for conversion of the portion of the input signal, the selected one or more sub-word DAC groups corresponding to the determined range of amplitudes of the portion of the input signal; and
   means for limiting the conversion of the portion of the input signal to using the selected one or more sub-word DAC groups.

24. The apparatus according to claim 23, wherein the input word is split into the plurality of sub-words by applying one or more noise-shaped segmentation techniques.

25. The apparatus according to claim 23, wherein the means for limiting the conversion comprises means for setting one or more sub-word DAC groups of the plurality of sub-word DAC groups which were not selected for the conversion to be in a low-power mode during the conversion.

26. The apparatus according to claim 23, further comprising:
   means for determining whether the range of amplitudes of the portion of the input signal is smaller than a threshold value,
   wherein the one or more sub-word DAC groups selected for the conversion are selected based on the threshold value when it is determined that the range of amplitudes of the portion of the input signal is smaller than the threshold value.

27. A digital-to-analog converter (DAC) for implementing one or more noise-shaped segmentation techniques, the DAC comprising:
   a plurality of sub-word DAC groups, where each sub-word DAC group is configured to convert a different sub-word of a plurality of sub-words split from each input word, and
   a controller configured to:
      determine a range of amplitudes of at least a portion of the input signal;
      select one or more sub-word DAC groups of the plurality of sub-word DAC groups for conversion of the portion of the input signal, the selected one or more sub-word DAC groups corresponding to the determined range of amplitudes of the portion of the input signal;
      limit the conversion of the portion of the input signal to using the selected one or more sub-word DAC groups; and
      set one or more sub-word DAC groups of the plurality of sub-word DAC groups which were not selected for the conversion to be in a low-power mode during the conversion.

28. A digital-to-analog converter (DAC) for implementing one or more noise-shaped segmentation techniques, the DAC comprising:
   a plurality of sub-word DAC groups, where each sub-word DAC group is configured to convert a different sub-word of a plurality of sub-words split from each input word, and
   a controller configured to:
      determine that a range of amplitudes of at least a portion of the input signal is smaller than a threshold value;
      select one or more sub-word DAC groups of the plurality of sub-word DAC groups for conversion of the portion of the input signal based on the threshold value; and
      limit the conversion of the portion of the input signal to using the selected one or more sub-word DAC groups.

* * * * *